US007944545B2

(12) United States Patent
Bagheri et al.

(10) Patent No.: US 7,944,545 B2
(45) Date of Patent: May 17, 2011

(54) HIGH CONTRAST LITHOGRAPHIC MASKS

(75) Inventors: Saeed Bagheri, Croton-on-Hudson, NY (US); David O. S. Melville, New York, NY (US); Alan E. Rosenbluth, Yorktown Heights, NY (US); Kehan Tian, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 89 days.

(21) Appl. No.: 12/463,742

(22) Filed: May 11, 2009

(65) Prior Publication Data

US 2010/0283982 A1 Nov. 11, 2010

(51) Int. Cl.
*G03B 27/42* (2006.01)
*G03B 27/52* (2006.01)
(52) U.S. Cl. .......................... 355/53; 355/55
(58) Field of Classification Search .................. 355/52, 355/53, 55, 77; 430/5, 20, 30; 716/19, 21
See application file for complete search history.

(56) References Cited

U.S. PATENT DOCUMENTS

| | | | |
|---|---|---|---|
| 5,680,588 A | 10/1997 | Gortych et al. | 395/500 |
| 5,991,006 A * | 11/1999 | Tsudaka | 355/53 |
| 6,444,373 B1 * | 9/2002 | Subramanian et al. | 430/5 |
| 6,869,738 B2 * | 3/2005 | Oshima et al. | 430/30 |
| 6,918,104 B2 * | 7/2005 | Pierrat et al. | 716/19 |
| 7,057,709 B2 | 6/2006 | Rosenbluth | 355/69 |
| 7,079,223 B2 | 7/2006 | Rosenbluth et al. | 355/67 |
| 7,802,226 B2 * | 9/2010 | Park et al. | 716/21 |

OTHER PUBLICATIONS

"Global Optimization of Masks, Including Film Stack Design to Restore TM Contrast in High NA TCC's", Alan E. Rosenbluth, et al, Proc. Of SPIE vol. 6520, pp. 1-13, Jul. 2007.
"Point Estimation of Simultaneous Methods for Solving Polynomial Equations: A Survey 11", Miodrag S. Petkovic, et al, Journal of Computational and Applied Mathematics, pp. 32-52, Jul. 2006.
"Finding Zeros of Maps: Homotopy Methods That Are Constructive With Probability One", Shui-Nee Chow, et al, pp. 887-899, Aug. 1997.
"A Transformation to Avoid Solutions at Infinity for Polynomial Systems", Alexander P. Morgan, pp. 77-86, Jan. 1986.
"A Homotopy For Solving Polynomial Systems" Alexander P. Morgan, pp. 87-92, Jan. 1986.
"Optimum Mask and Source Patterns to Print a Given Shade", Alan E. Rosenbluth, et al, 2002 Society of Photo-Optical Instrumentation Engineers, pp. 13-30, Apr. 2002.

* cited by examiner

*Primary Examiner* — Hung Henry Nguyen
(74) *Attorney, Agent, or Firm* — Harrington & Smith

(57) ABSTRACT

A structure and a method for an equi-brightness optimization. The method may include projecting a plurality of bright patterns having a plurality of bright points and a plurality of dark patterns having a plurality of dark points on a substrate, generating a plurality of joint eigenvectors of the plurality of bright points and a plurality of dark points, selecting a predetermined number of joint eigenvectors to project the plurality of bright patterns, generating a plurality of natural sampling points from the plurality of bright points, wherein the plurality of natural sampling points has a substantially equal intensity, and obtaining a representation of an aperture from the plurality of natural sampling points, wherein an image of the representation of the aperture has a substantially uniform intensity.

23 Claims, 15 Drawing Sheets

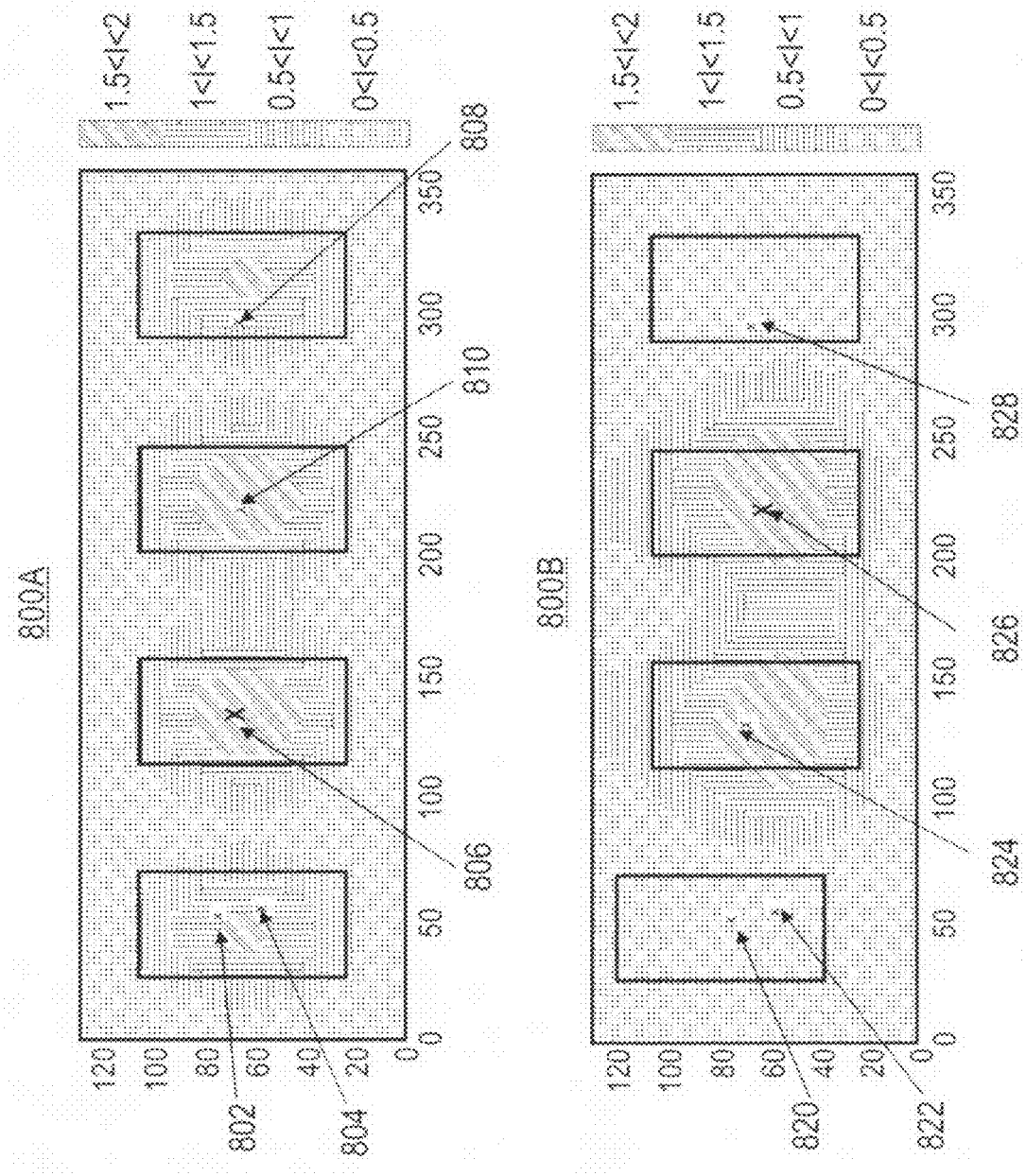
FIG. 8 (Contd.)

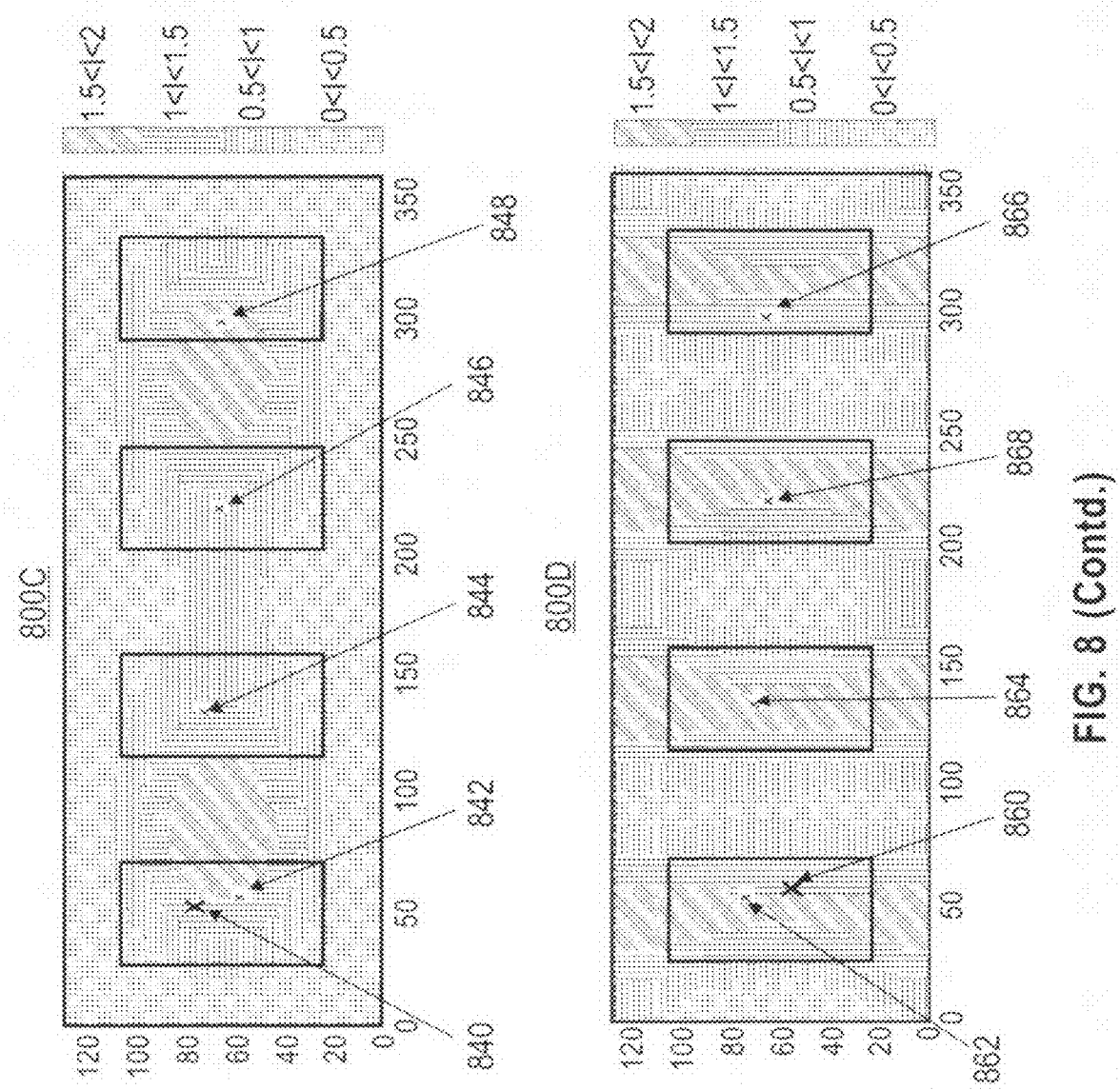
FIG. 8 (Contd.)

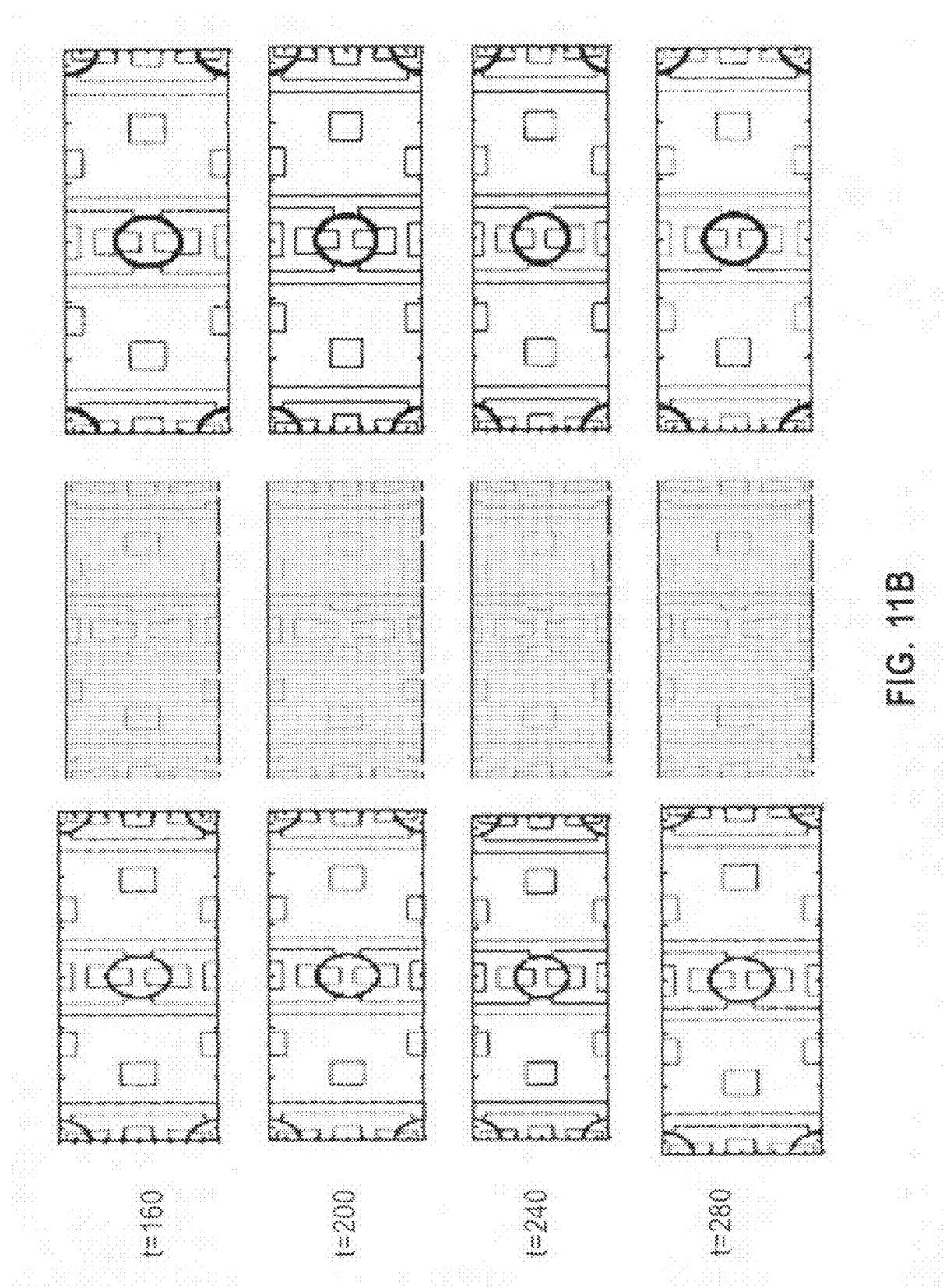

HIGH CONTRAST LITHOGRAPHIC MASKS

CROSS REFERENCE TO RELATED APPLICATION

Not applicable.

BACKGROUND

1. Field

The present disclosure relates to lithographic masks and more specifically to a method and system to perform an equi-brightness optimization.

2. Description of Related Art

Typically, a mask optimization problem for a given source, such as an optical source, in a projection nanolithography imaging system may be written as a quadratic problem $$a^* = \operatorname{argmin} \sum_{v=1}^{v_{max}} a^T c_v A_v a, \quad (1)$$

$$a^T A_u a \geq 1, 1 \leq u \leq u_{max}$$

where $a \in R^n$ is a vector with the amplitude of all of the diffraction orders in a mask, the diffraction orders being transferable through a partially coherent projection nanolithography imaging system. In particular, a* represents an amplitude of diffraction orders in an optimum mask. A mask may be fabricated, without more, with the information in a*.

Matrices $A_u$ and $A_v$ are specific to the given source and provide an imaging system model for bright points u and dark points v at an image plane. Specifically, $a^T A_i a$ represents an intensity at point i due to a mask having diffraction orders given by a and an imaging system model (having a set source, for example) given by $A_i$. Positions of bright points 1, 2 . . . $u_{max}$ are decided based upon a pattern for printing. Initially, the bright points 1, 2 . . . $u_{max}$ may be substantially uniformly distributed within bright regions of the pattern for printing. Similarly, positions of dark points 1, 2 . . . $v_{max}$ are decided based upon the pattern for printing. Initially, the dark points 1, 2 . . . $v_{max}$ may be substantially uniformly distributed within dark regions of the pattern for printing. Coefficients $c_v$ for the dark points act as a weighting factor, often emphasizing the dark points closer to the bright regions.

A detailed expression for $A_i$ depends on an optical source pattern, an intensity and a polarization of the optical source, fundamental properties of the projection nanolithography imaging system and a location of the bright points and dark points which in turn depends on an ideal wafer pattern.

BRIEF SUMMARY

Embodiments of the present disclosure provide a structure and method for performing an equi-brightness optimization. The present disclosure teaches how to perform an equi-brightness optimization applied, for example, to a mask used in semiconductor processing.

Briefly described, in architecture, one embodiment of the structure of a system, among others, can be implemented as follows. The system may include a projecting device configured to project a plurality of bright patterns having a plurality of bright points and a plurality of dark patterns having a plurality of dark points on a substrate, a first processor configured to generate a plurality of joint eigenvectors of the plurality of bright points and a plurality of dark points, a selector configured to select a predetermined number of joint eigenvectors to project the plurality of bright patterns, a second processor configured to generate a plurality of natural sampling points from the plurality of bright points, wherein the plurality of natural sampling points has a substantially equal intensity, and a third processor configured to obtain a representation of an aperture from the plurality of natural sampling points, wherein an image of the representation of the aperture has a substantially uniform intensity.

The present disclosure can also be viewed as providing a method for performing an equi-brightness optimization. The method may include projecting a plurality of bright patterns having a plurality of bright points and a plurality of dark patterns having a plurality of dark points on a substrate, generating a plurality of joint eigenvectors of the plurality of bright points and a plurality of dark points, selecting a predetermined number of joint eigenvectors to project the plurality of bright patterns, generating a plurality of natural sampling points from the plurality of bright points, wherein the plurality of natural sampling points has a substantially equal intensity, and obtaining a representation of an aperture from the plurality of natural sampling points, wherein an image of the representation of the aperture has a substantially uniform intensity.

BRIEF DESCRIPTION OF THE SEVERAL VIEWS OF THE DRAWINGS

Many aspects of the disclosure can be better understood with reference to the following drawings. Components in the drawings are not necessarily to scale, emphasis instead being placed upon clearly illustrating principles of the present invention.

FIGS. 11A-11C illustrate simulation results involving a real design, a target design, and a mask of the present disclosure.

DETAILED DESCRIPTION

Figure 1:
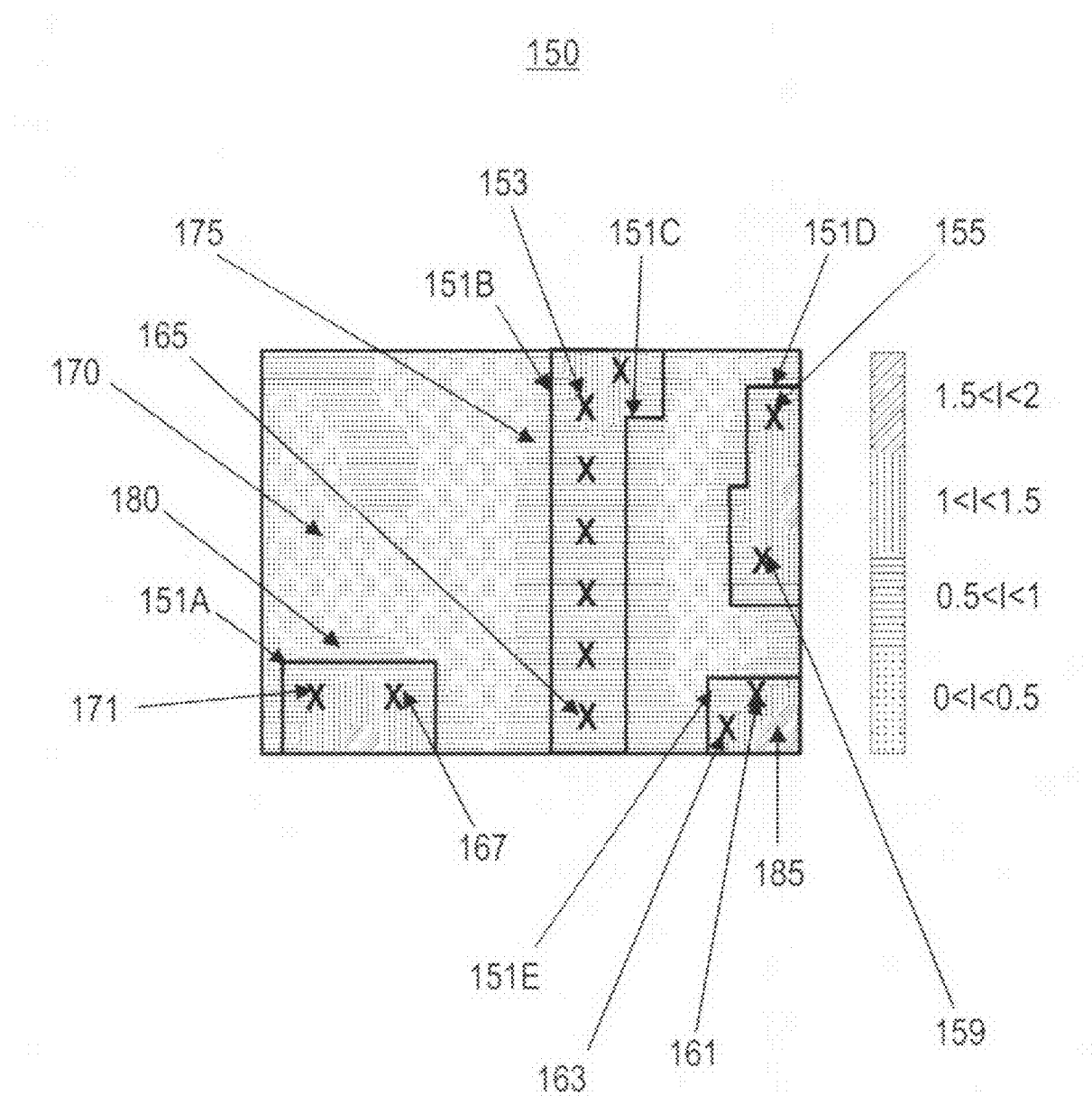
FIG. 1 illustrates a distribution of intensity of illumination on a wafer according to an embodiment of the present disclosure.

The present disclosure relates to lithographic masks and more specifically to a method and system to perform an equi-brightness optimization. FIG. 1 illustrates a distribution of intensity of illumination on a wafer 150 according to an embodiment of the present disclosure. The wafer 150 may include a first feature 151A, a second feature 151B, a third feature 151C, a fourth feature 151D, and a fifth feature 151E as well as at least four components of an intensity profile. The four components may be areas 170, 175, 180, and 185. The area 170 may correspond to a unitless intensity ranging between 0 and 0.5, the area 175 may correspond to a unitless intensity ranging between 0.5 and 1.0, the area 180 may correspond to a unitless intensity ranging between 1.00 and 1.5, and the area 185 may correspond to a unitless intensity ranging between 1.5 and 2.0 as illustrated by a scale on a right side of FIG. 1.

Natural sampling points 167, 171 may be included in the first feature 151A. Natural sampling points 153, 165 may be included in an area enclosed by the second feature 151B and the third feature 151C. As may be seen, there may be more natural sampling points indicated by "x" in the area enclosed by the second feature 151B and the third feature 151C. Natural sampling points 155, 159 may be included in the fourth feature 151D. Natural sampling points 161, 163 may be included in the fifth feature 151E. The second feature 151B and the third feature 151C may together define an area on the wafer 150. One or more of the natural sampling points 167, 171, 153, 165, 155, 159, 161, 163 may be equi-brightness points.

Figure 2:
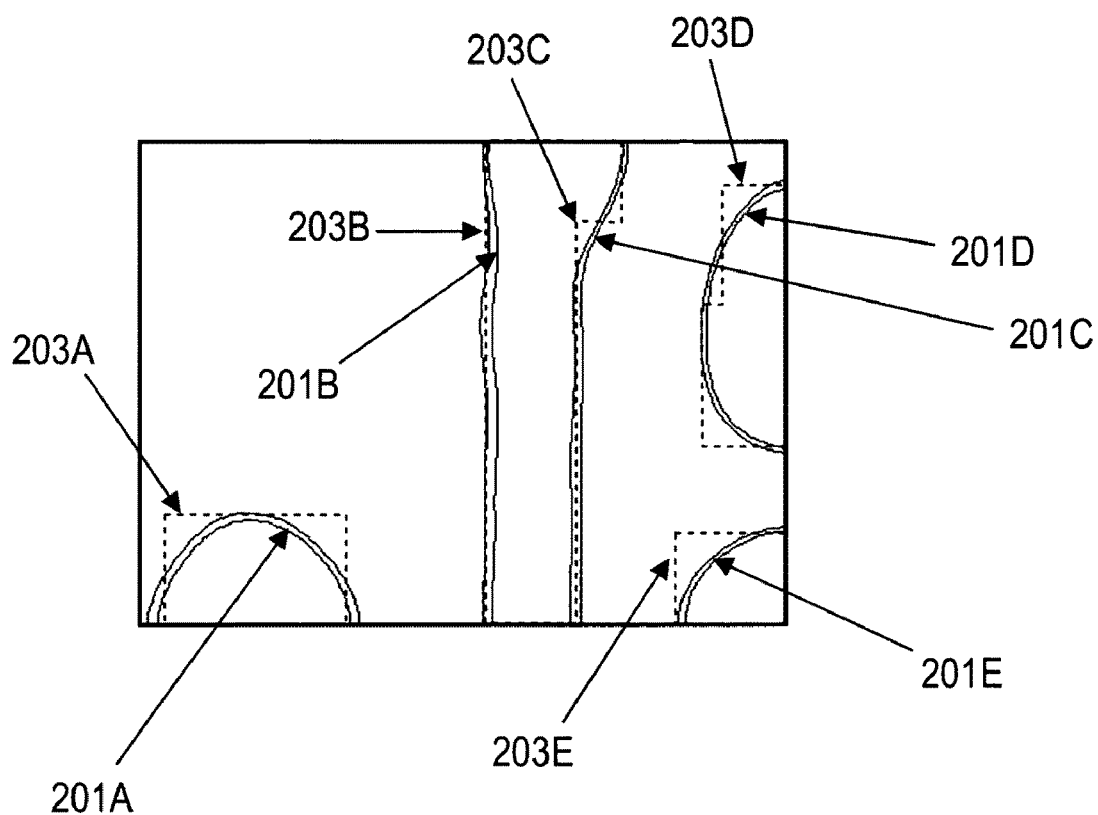
FIG. 2 illustrates shapes expected to be printed on the wafer according to an embodiment of the present disclosure.

FIG. 2 illustrates shapes expected to be printed on a wafer 200 according to an embodiment of the present disclosure. The wafer 200 may be an embodiment of the wafer 150 of FIG. 1. The wafer 200 may include a first feature 203A, a second feature 203B, a third feature 203C, a fourth feature 203D, and a fifth feature 203E. The second feature 203B and the third feature 203C may together define an area on the wafer 200. FIG. 2 also features process variation (PV) bands 201A, 201B, 201C, 201D, and 201E. A thickness of the PV band, generally indicated by two lines running together, may depend on a semiconductor process or an optimization process used.

An average dark region matrix may be defined as $$A_0 = \sum_{v=1}^{v_{max}} c_v A_v, \quad (2)$$

and an optimal mask may be written as $a^* = \text{argmin } a^T A_0 a.$ $a^T A_u a \geq 1, 1 \leq u \leq u_{max}$ (3)

A transformation from a mask diffraction order space (a) to a joint eigenvector space ($\alpha$) may be performed, where a may be related to a using a relation $a = W\alpha,$ (4)

where $W = E_Q D_Q^{-1/2} E_B$. Here, $E_Q$ may represent a column-matrix having eigenvectors of a matrix $A_Q$ and $D_Q$ may represent a diagonal matrix having eigenvalues of a matrix $A_Q$. Furthermore, $A_B$ may be defined as $$A_B = D_0^{-1/2} E_0^T \left( \sum_{u=1}^{u_{max}} A_u \right) E_0 D_0^{-1/2}. \quad (5)$$

Changing the variable a in Eq. (3) using the relation in Eq. (4) the following expression for the optimal mask may be obtained:

$a^* = W \text{ argmin } \alpha^T \alpha,$ $\alpha^T B_u \alpha \geq 1, 1 \leq u \leq u_{max}$ (6)

where $B_u = E_B^T D_0^{-1/2} E_0^T A_u E_0 D_0^{-1/2} E_B$. It may be noted that in Eq. (6), the optimum mask diffraction order a* may be described as a substantially closest point to an origin located outside all of the hyper-ellipsoids generated by $\alpha^T B_u \alpha \geq 1$, wherein u may be indexed as $1 \leq u \leq u_{max}$. Furthermore, an $i^{th}$ coordinate in the joint eigenvector space $\alpha$ may be related to the mask diffraction order space by an $i^{th}$ column of W, or in other words, by an $i^{th}$ joint eigenvector. Hence, an importance of each coordinate may be assessed by investigating a corresponding joint eigenvector. There may be a high probability that that a relatively few joint eigenvectors of higher eigenvalue may be sufficient to produce an above-threshold illumination at practically all bright points. The joint eigenvectors may also be thought of as solutions to a relaxed average image contrast problem. Specifically, the average image contrast may be equal to an eigenvalue of an eigenvector solution to the relaxed average image contrast problem, and in a mixed case, as discussed in context of Eq. (10) described below, the eigenvalue of an eigenvector solution may be a weighted average of all eigenvalues weighted by an energy content. A solution to the relaxed average image contrast problem may not generally provide a full spatial coverage at all of the bright points, but the joint eigenvectors may tend to be spatially well isolated, allowing a preferred set of eigenvector choices for covering all of the bright points to be identifiable with reasonable certainty. Hence, the joint eigenvalue may be used to identify a minimal set, the minimal set being likely to maximize the relaxed average image contrast, to provide the full spatial coverage. A more robust performance may be possible with some refinement as described below.

In order to reduce computing costs, it may be preferable to have a minimum possible number of joint eigenvectors necessary for a pattern for printing. An algorithm of the present disclosure finds the joint eigenvectors which light up bright points of an image equivalently and do not transfer too much energy to dark regions of the image. To achieve this, an intensity due to each eigenvector at the bright points and the dark points may be evaluated both individually and by weighted average. Furthermore, various ratios of these intensities may be considered to render a coverage of the bright points may be substantially uniform. In an illustrative algorithm of the present disclosure, several predetermined thresholds may be applied to decide whether a ratio or a difference may be acceptable. Such predetermined thresholds may be changed during the algorithm, for example.

If a summation of the intensity of the dark points produced by each joint eigenvector is more than a predetermined threshold for a joint eigenvector, then that joint eigenvector may be omitted. A matrix containing all of the remaining joint eigenvectors may be termed S. An intensity due to an $i^{th}$ joint eigenvector at point x in a wafer may be termed $s_x^i$.

For each bright point u, all joint eigenvectors in S may be considered such that $s_u^i$, an intensity due to an $i^{th}$ joint eigenvector at point u, may be more than another predetermined threshold. If a ratio $\max_v(s_v^i/s_u^i)$ is more than a predetermined threshold, where $s_v^i$ may be an intensity due to the $i^{th}$ joint eigenvector at point v, the joint eigenvectors related to the numerator and the denominator may be omitted. Among the remaining joint eigenvectors the joint eigenvectors having a maximum ratio $$\left( \sum_{u=1}^{u_{max}} s_u^i \right) / \left( \sum_{v=1}^{v_{max}} s_v^i \right)$$

may be selected. The selected joint eigenvectors for all bright points u may be collected and stacked in a matrix called $\overline{W}$ and the indices of the selected eigenvectors may be collected in a set $I_{TP}$. All bright points u may be checked to have at least one joint eigenvector, i, in matrix $\overline{W}$ such that $s_u^i$ may be more than a predetermined threshold, indicating there may be enough joint eigenvectors, and if not, the thresholds may be adjusted and the aforementioned steps may be performed again until $s_u^i$ may be more than the predetermined threshold.

To help achieve a substantial uniformity in the intensity of the bright points u being covered by calculating a peak ratio, $\eta_{u*}$, for each bright point of interest, the bright points of interest being represented by u*, as below:

$$\eta_{u*} = \min_{u \in B} \left\{ \frac{\max_{i \in 1_W} s_{u*}^i}{\max_{i \in 1_W} s_u^i} \right\}. \tag{7}$$

A check may be made to make sure for all of the bright points u, $\eta_u$ may be less than a predetermined threshold. If $\eta_u$ is not less than the predetermined threshold, then one or more unselected joint eigenvectors may be added to selected joint eigenvectors, for example, by adding a column to $\overline{W}$, such that $\eta_u$ may be less than the predetermined threshold. If one or more desired joint eigenvectors are not found, the predetermined threshold may be adjusted and the abovementioned procedures may be performed until $\eta_u$ may be less than a predetermined threshold for all bright points u∈B.

Out of n original joint eigenvectors, m joint eigenvectors may be selected. Further, the m joint eigenvectors under consideration may be located in a first m column of the matrix W. Optimum mask diffraction orders may be written as $$a^* = \overline{W} \arg \min \overline{\alpha}^T \overline{\alpha},$$

$$\overline{\alpha}^T \hat{B}_u \overline{\alpha} \geq 1, 1 \leq u \leq u_{max} \tag{8}$$

where $\overline{W}$ may be an n×m matrix equal to the first m columns of W, $\overline{\alpha} \in \Re^m$ may be a vector equal to the first m components of α and $\hat{B}_u$ may be an m×m matrix equal to the first m rows and first m columns of $B_u$.

Equation (8) may represent a quadratic problem having non-convex quadratic constraints. An optimal lithographic solution may likely produce a roughly binary image on the wafer 150 and, therefore, may provide roughly equal intensities at the bright points and in particular at natural sample points, described in detail below. The natural sample points may be deployed in the bright regions of the image.

It may be noted that Eq. (8) may provide a solution as close as possible to the origin while keeping the intensities of the bright points larger than unity in a joint eigenvector space of a joint eigenvector shown in FIGS. 5 and 8 described below.

On considering the optimum mask diffraction orders, a*, and the wafer intensity using a mask which produces the optimum mask diffraction orders, there may exist a plurality of sets of points in the wafer 150 which not only has relatively large intensities but also has equal intensities. Among all of the plurality of sets of points, a set having maximum common intensity for points constituting the set may be selected. This set may be called a natural set and the points of the natural set may be termed natural sampling points (NSPs) represented by an index μ. The natural sampling points may not necessarily be the same as the bright points u discussed above.

An equi-brightness optimization may be similar to Eq. (8), where the inequality constraints at the bright points may be replaced by equality constraints in the natural sampling points as follows:

$$a_0^* \in \overline{W} \arg \min \overline{\alpha}^T \overline{\alpha}. \tag{9}$$

$$\overline{\alpha}^T \hat{B}_\mu \overline{\alpha} = 1, 1 \leq \mu \leq m$$

Eq. (9) may perform a transformation from an eigenvector space to a diffraction order space. Although a solution to Eq. (9) for $a_0^*$ may be generally different than a solution to Eq. (8) for a*, experiments may show that these two solutions may not be too different from each other in a Euclidean sense. Hence, once the solution to $a_0^*$ is known, the solution to a* may be found using a local optimizer with a known solution used, and vice versa, as a starting estimate for an unknown solution. It may be noted that Eq. (9) having equality constraints may be a simpler problem compared to Eq. (8). Furthermore, as discussed below, it may be seen why a migration from Eq. (8) to Eq. (9) may be beneficial.

A next step in defining the equi-brightness concept may be finding the natural sampling points. It may be noted that the number of NSPs matches a dimension of $\overline{\alpha}$, i.e., m. Accordingly, it follows that the number of selected points in an image increases if $u_{max} < m$ and the number of selected points in the image decreases if $u_{max} > m$. The foregoing may be logical because m may be a close measure of a Nyquist limit and having relatively more or less bright points may be not optimal. Regarding finding the NSPs, it may also be noted that the NSPs may preferably be equi-brightness points. For example, NSPs may be set to a value, hence the "equi-brightness" concept, rather than setting the bright point intensities to more than a threshold. Based on a choice of NSPs, Eq. (9) may have no real solutions. However, an optimal image may come close to satisfying Eq. (9) constraints. Incorporating minor adjustments, the optimal image may substantially exactly satisfy Eq. (9). Further, it may be logical that the local optimizer may follow the minor adjustments in reverse. Algorithm Algorithms for finding the NSPs are discussed below.

Let a label $e_\mu$ indicate a point on the wafer 150 at which the intensity profile produced by joint eigenvector μ, such as a joint eigenvector 800A shown in FIG. 8 described below, reaches its maximum, the maximum intensity being termed $s_e^\mu$. An NSP associated with each point $e_\mu$, ∀μ=1 … m may be found as follows. Assuming a pattern to be printed includes some closed polygon regions, also termed as a feature, there may be a set S of joint eigenvectors for which $e_\mu$ may be inside the feature. For each joint eigenvector in the set S, a set of all bright points, u, may be found which may be substantially within a circle of a given radius around $e_\mu$. A geometrical average of all bright points u as well as of $e_\mu$ may be found to get the NSP $\overline{e}_\mu$. By repeating the foregoing for all of the members of the set S and for all of the features, all m NSPs may be found.

The above algorithm may be termed as a homogeneous NSP selection. Rather than using the positions of eigenvector lobe peak intensity $e_\mu$, such as a peak intensity of a joint eigenvector 800A shown in FIG. 8 described below, other geometrical methods may be used for laying out sample points within bright regions of a design. A number of interior bright sample points provided by these methods may approximate the number m of selected joint eigenvectors, and the algorithm settings may be adjusted in a predetermined manner to help achieve an equality between the number of interior bright sample points and the number m of selected joint eigenvectors.

In another preferred embodiment of the present disclosure, NSPs may be considered where the NSPs may have inhomogeneous equations defining a generalized equi-brightness concept shown below:

$$a_0^* \in \overline{W} \arg \min \overline{\alpha}^T \overline{\alpha}. \tag{10}$$

$$\sum_{\mu=1}^{M} c_\mu^j \overline{\alpha}^T \hat{B}_\mu \overline{\alpha} = c_0^j, 1 \leq j \leq m$$

where $c_\mu^j$ may be scalar constants that, for example, may represent intensity averaging. This generalized equi-brightness concept may have several advantages. A preferred advantage may be that there remains no longer a preference to have the same number of NSPs as the number of selected joint eigenvectors. Another advantage may be that an intensity of some NSPs may be set to be floating equal, i.e., not setting to a specific value. A still further advantage may be to set different intensities for different NSPs. For the NSPs, all intensities may be set equal, or all intensities may be set equal to an arbitrary or unknown value, or there may be a combination of the intensities being equal and the intensities being set to an arbitrary or unknown value. Discussed below are two implications of the generalized equi-brightness concept.

One option may be to set M=m and $c_\mu^j=0$ when $\mu \neq j>0$. Then there will be the same number of NSPs as the number of joint eigenvectors. However, in this embodiment, the NSPs may simply be taken to be an original bright points and the appropriate values for $c_\mu^0$, i.e., intensity of the original bright points, may preferably be selected. A method for estimating $c_\mu^0$ may be to consider their average distance of the original bright points, such as bright points 506A, 506B, 506C of FIG. 5 described below from neighboring edge points, such as neighboring edge points 510A, 510B, 510C of FIG. 5 described below.

Another option in using Eq. (10) may be to choose the edge points as NSPs. Then M may often be larger than m. An advantage of this option may be that the intensity of all edge points in the image may be set to be identical. In practice the foregoing approximation may be satisfied very closely on applying optical proximity correction (OPC) constraints. On applying the OPC constraints the edge intensities may be set substantially equal under a threshold process model. As a result there may arise a need to have more than one such equation for all of the edge points.

Accordingly, one edge may be selected from each feature and an intensity of the one edge may be set equal to unity. This may be accomplished either directly or by setting the intensity equal to the intensity of an edge point which has an intensity of unity. Next, the intensity of the rest of the edge points may be set to be mutually equal or a summation of the respective intensities of the rest of the edge points may be set to be equal to the number of edge points in the sum.

Figure 3:
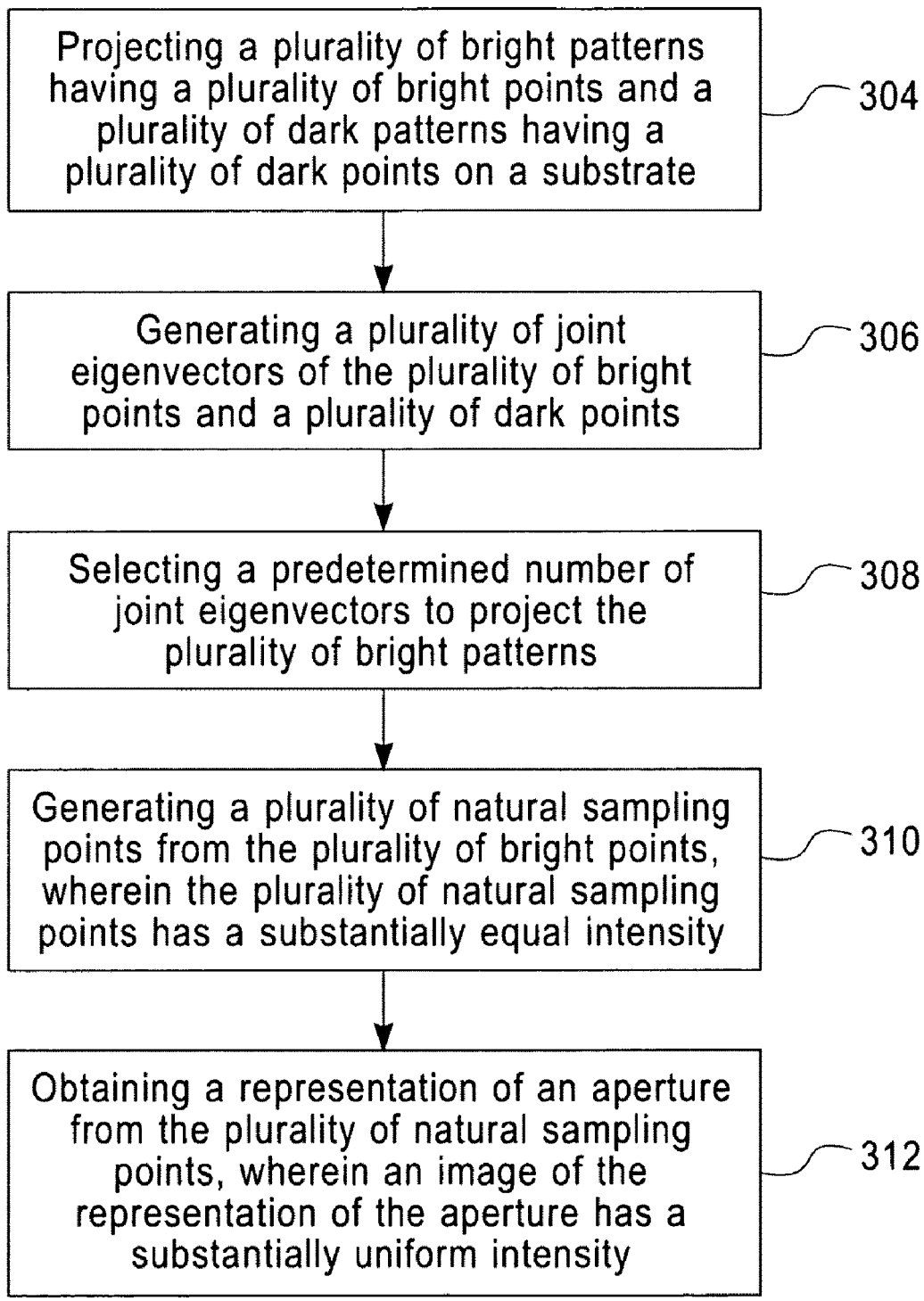
FIG. 3 illustrates an embodiment of a method of the present disclosure.

FIG. 3 illustrates an embodiment of a method 300 of the present disclosure. The method 300 may include projecting a plurality of bright patterns having a plurality of bright points and a plurality of dark patterns having a plurality of dark points on a substrate (block 304), such as the wafer 150 of FIG. 1, generating a plurality of joint eigenvectors of the plurality of bright points and a plurality of dark points (block 306), such as a joint eigenvector 800A shown in FIG. 8 described below, selecting a predetermined number of joint eigenvectors to project the plurality of bright patterns (block 308), such as joint eigenvectors 800A, 800B, 800C, 800D, 800E shown in FIG. 8 described below, generating a plurality of natural sampling points from the plurality of bright points, wherein the plurality of natural sampling points has a substantially equal intensity (block 310), and obtaining a representation of an aperture from the plurality of natural sampling points, wherein an image of the representation of the aperture has a substantially uniform intensity (block 312). An example of the image of the representation of the aperture may be an image of one or more of the apertures 702, 704, 708, 712, of the mask 700 as shown in FIG. 7 discussed below. It may be noted that the projecting the plurality of bright patterns having the plurality of bright points and the plurality of dark patterns having the plurality of dark points may be accomplished by configuring the optical source to illuminate a real design, such as a real design 600 of FIG. 6 discussed below.

In the method 300, the projecting the plurality of bright patterns may include illuminating a mask feature. An example of a mask feature may be an aperture 702, 704, 708, 712, as shown in FIG. 7 discussed below. In the method 300, the image of the representation of the aperture may be set substantially equal to a predetermined intensity. The illuminating the mask feature may include illuminating a plurality of mask features. In the method 300, the generating the plurality of natural sampling points may include setting the plurality of natural sampling points substantially equal to a predetermined intensity. In the method 300, the projecting the plurality of bright patterns may include selecting at least one of an intensity distribution having a predetermined value, a polarization distribution having a predetermined value, a substantially ideal substrate pattern having a predetermined value, a numerical aperture having a predetermined value, and a wavelength of illumination having a predetermined value. One or more of the foregoing predetermined values may be selected for accomplishing a resolution of an image on the wafer 150, and a desired polarization. As an example, the intensity distribution of an image may change depending on a feature to be printed. As known to a person having ordinary skill in the art, the numerical aperture is a term encountered in the fields of optics, and laser physics, for example. In the method 300, the projecting the plurality of bright patterns may include generating a dark region matrix, such as matrix $A_0$, from the plurality of dark points. In the method 300, the projecting the plurality of bright patterns may include generating a bright region matrix, such as the matrix $\overline{W}$, from the plurality of bright points.

In the method 300, the generating the plurality of joint eigenvectors may include generating a plurality of joint eigenvalues of the plurality of bright points. In the method 300, the generating the plurality of joint eigenvectors may include generating a plurality of joint eigenvalues of the plurality of dark points. In the method 300, the generating the plurality of natural sampling points may include resampling to obtain substantially equal intensities at the plurality of natural sampling points. In the method 300, the generating the plurality of natural sampling points may include at least one of selecting a plurality of homogeneous natural sampling points described above, and selecting one or more of a plurality of edge points, described above, as the plurality of natural sampling points. In the method 300, the obtaining the representation of the aperture may include obtaining the representation of a plurality of apertures included in a mask. The solving the plurality of quadratic equations may include applying a homotopy. In the method 300, the obtaining the representation of the aperture may include obtaining an equi-brightness aperture. Further, in the method 300, the obtaining the representation of the aperture may include optimizing the representation of the aperture by processing a plurality of solutions of a plurality of equations. In the method 300, the generating the plurality of natural sampling points may include setting a predetermined number of the plurality of NSPs substantially equal to a predetermined number of a predetermined set of the plurality of joint eigenvectors. In the method 300, the generating the plurality of natural sampling points may include processing, such as by adding or deleting as related to a row of a matrix, one joint eigenvector in a step for attaining a predetermined threshold substantially equal to a predetermined intensity.

Figure 4:
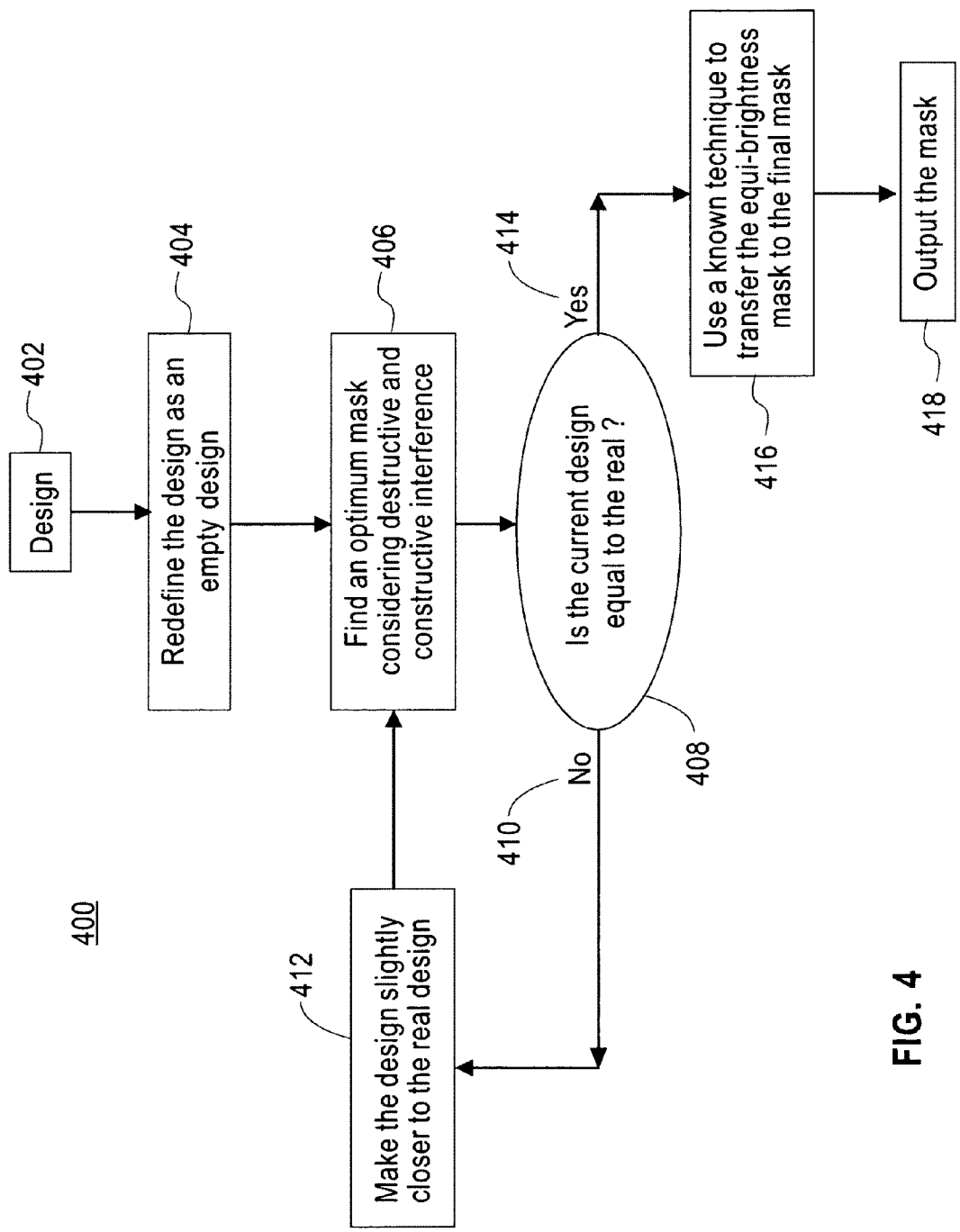
FIG. 4 illustrates another embodiment of a method of the present disclosure.

FIG. 4 illustrates an embodiment of a method 400 of the present disclosure. A design may be selected (block 402), the design may be redefined as an empty design (block 404) where $2^m$ solutions may be generated, an optimum mask may be found considering destructive and constructive interference (block 406), a check is made "Is the current design equal to the real design?" (block 408), if the response to the check is in the negative (block 410), the design is made slightly closer to the real design, for example, in a Euclidean sense, (block 412), if the response to the check is in the affirmative (block 414), where $2^m$ new solutions may be generated, a known technique may be used to transfer the equi-brightness mask to the final mask (block 416), and the mask may be output (block 418).

Figure 5:
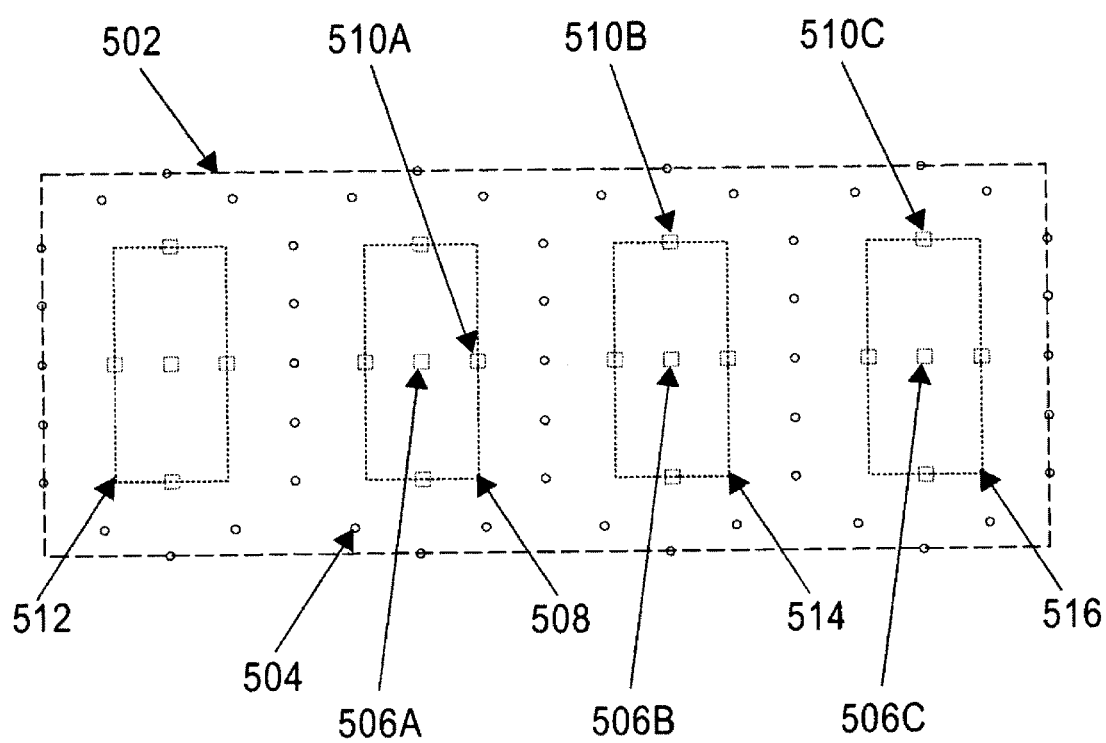
FIG. 5 illustrates a design pattern, having dark points, neighboring edge points, and bright points, of the present disclosure.

FIG. 5 illustrates a typical design pattern 500, having dark points, neighboring edge points, and bright points, of the present disclosure. The dark points 504, neighboring edge points 510A, 510B, 510C, the bright points 506A, 506B, 506C, and four contact patterns are indicated inside an ideal design 502. The four contact patterns of the ideal design 502 may be termed as contact patterns 508, 512, 514, 516.

Figure 6:
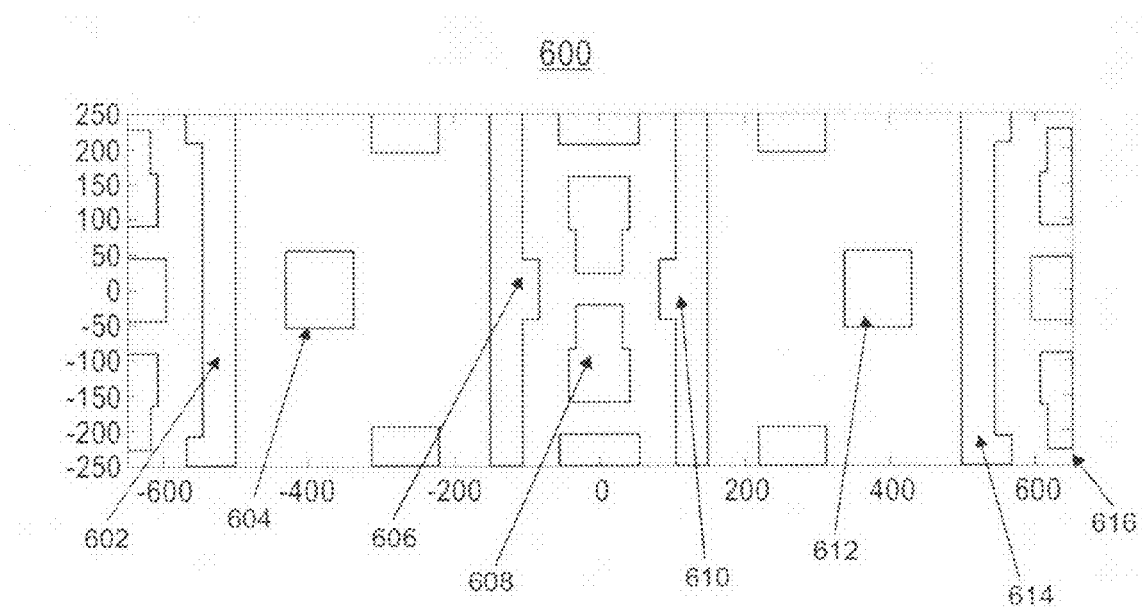
FIG. 6 illustrates a real design of the present disclosure.
Figure 7:
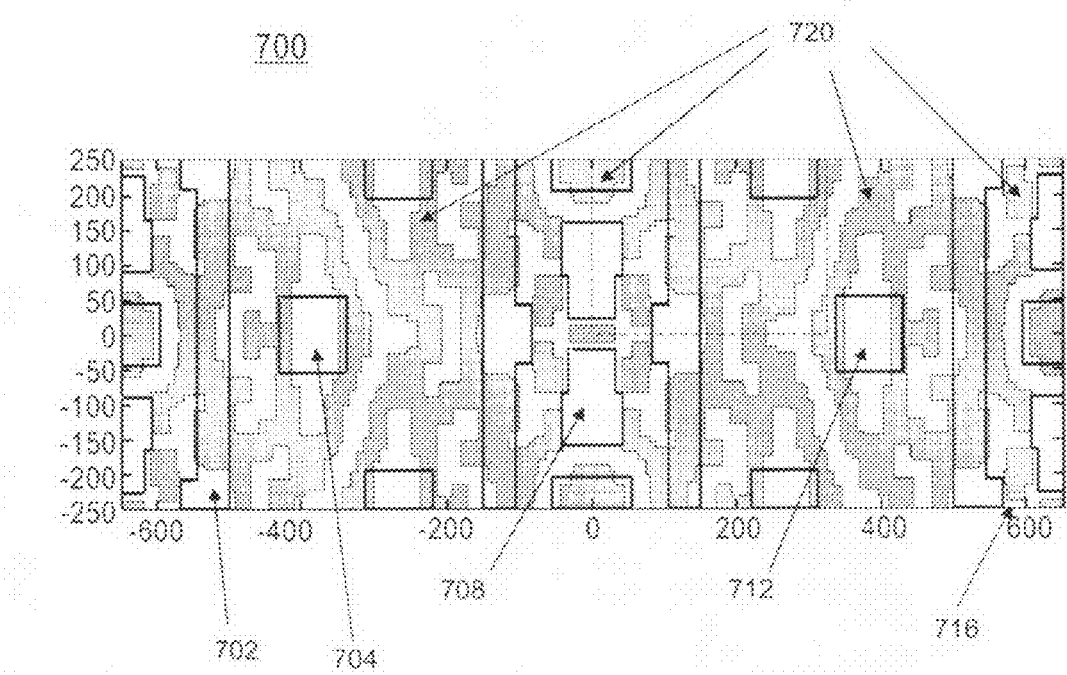
FIG. 7 illustrates a mask design based on the real design of the present disclosure.

FIG. 6 illustrates a real design 600 of the present disclosure. The real design 600 shows areas 602, 604, 606, 608, 610, 612, and 614, and a border 616 which may form a desired pattern on a semiconductor chip. Units shown on a horizontal axis and a vertical axis may be in nanometers.

FIG. 7 illustrates a mask 700 based on the real design 600 of the present disclosure. Units shown on a horizontal axis and a vertical axis may be in nanometers. The mask 700 shows apertures 702, 704, 708, 712, and a border 716 which may correspond to the real design 600. Area indicated by reference character 720 defines the mask 700 where one or more optimization processes may have brought the open frame mask closer to the mask 700. Using the mask 700 may help printing the real design 600 on the semiconductor chip. The mask 700 may be a Chromeless Phase Lithography (CPL) mask. The apertures 702, 704, 708, 712 may permit a light to pass through the mask 700 freely. The areas indicated by the reference character 720 may reverse the phase of the light upon passage through the mask 700.

Figure 8:
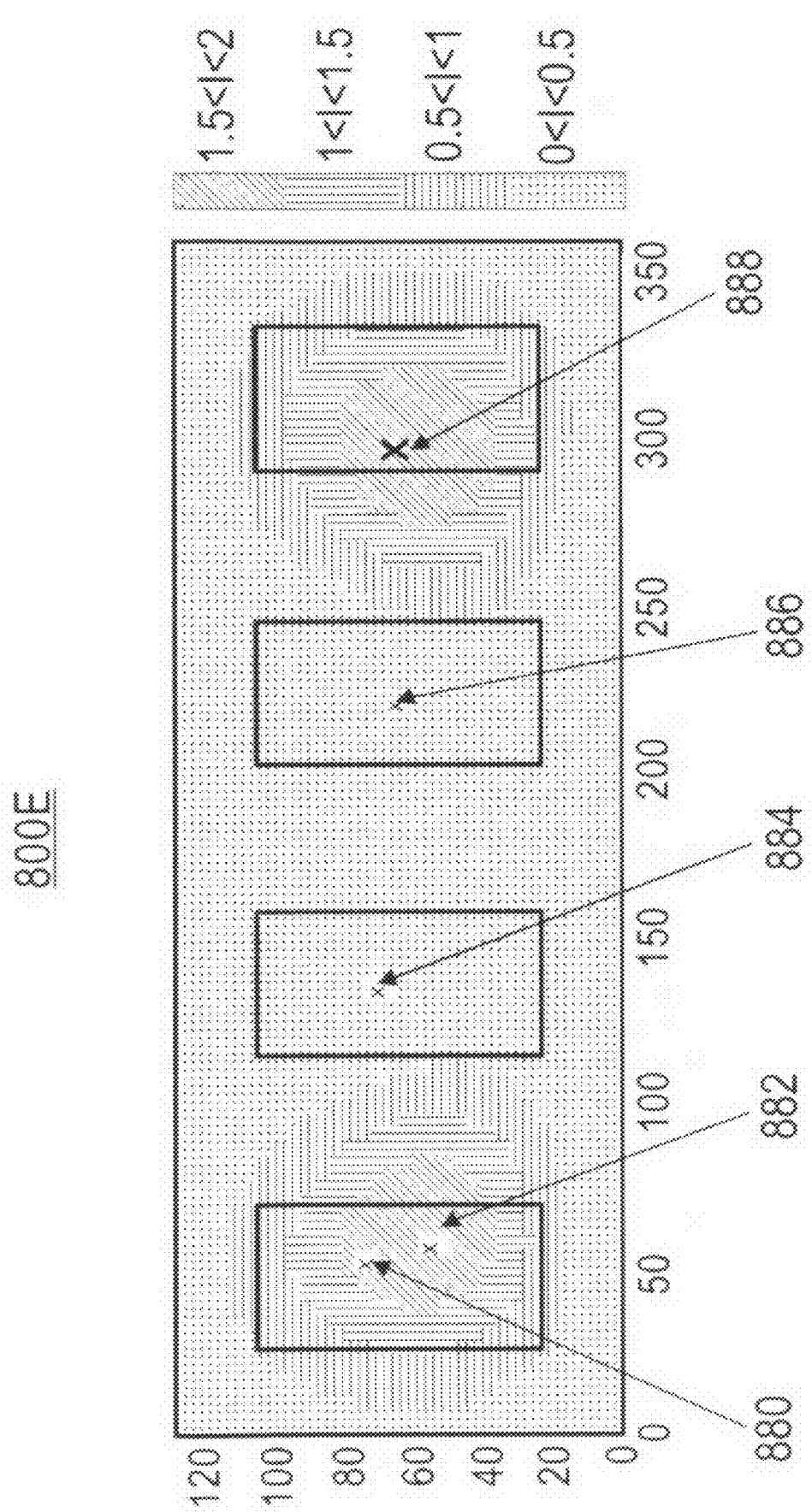
FIG. 8 illustrates eigenvectors showing intensity profiles of respective joint eigenvectors of the present disclosure.

FIG. 8 illustrates eigenvectors 800A, 800B, 800C, 800D, and 800E showing intensity profiles of respective joint eigenvectors of the present disclosure. On the right hand side of the eigenvectors 800A, 800B, 800C, 800D, and 800E are shown scales of unitless intensity, I, having ranges of 0 through 0.5, 0.5 through 1, 1 through 1.5, and 1.5 through 2. Units shown on a horizontal axis and a vertical axis may be in nanometers. In the eigenvector 800A, natural sampling points 802, 804, 808, and 810 are shown by a smaller "x" having respective intensity profiles. A natural sampling point 806 (larger "x"), indicating an NSP associated with the eigenvector 800A, may be shown with a respective intensity profile. Compared to other eigenvectors in the FIG. 8, the eigenvector 800A shows the maximum eigenvalue as all four contact patterns of the ideal design 502, such as the contact patterns 508, 512, 514, 516 shown in FIG. 5, may be discerned.

In the eigenvector 800B, natural sampling points 820, 822, 824, and 828 are shown having respective intensity profiles. A natural sampling point 826 (larger "x"), indicating an NSP associated with the eigenvector 800B, may be shown with a respective intensity profile. In the eigenvector 800C, natural sampling points 840, 844, 846, and 848 are shown having respective intensity profiles. A natural sampling point 842 (larger "x"), indicating an NSP associated with the eigenvector 800C, may be shown with a respective intensity profile. In the eigenvector 800D, natural sampling points 862, 864, 866, and 868 are shown having respective intensity profiles. A natural sampling point 860 (larger "x"), indicating an NSP associated with the eigenvector 800D, may be shown with a respective intensity profile. In the eigenvector 800E, natural sampling points 880, 882, 884, and 886 are shown having respective intensity profiles. A natural sampling point 888 (larger "x"), indicating an NSP associated with the eigenvector 800E, may be shown with a respective intensity profile.

It may be noted that eigenvectors 800A, 800B, 800C, 800D, 800E may illuminate bright regions but may not illuminate dark regions such as of the mask 700 of FIG. 7. Among the eigenvectors 800A, 800B, 800C, 800D, and 800E, the eigenvector 800E may have the smallest eigenvalue illustrated by missing the NSPs 884 and 886. The eigenvector 800B has an eigenvalue less than the eigenvalue of eigenvector 800A. The eigenvector 800C has an eigenvalue less than the eigenvalue of eigenvector 800B. The eigenvector 800D has an eigenvalue less than the eigenvalue of eigenvector 800C. The eigenvector 800E has an eigenvalue less than the eigenvalue of eigenvector 800D. Further, as an example, it may be noted that if the eigenvector 800A is subtracted from the eigenvector 800B, there may be enough intensity remaining for contact patterns 508, 512, 514, 516, shown in FIG. 5, to be printed by a lithographic process. It may be further possible to assign a predetermined weight to one or more of the eigenvectors 800A, 800B, 800C, 800D, 800E for obtaining a mask, such as the mask 700 of FIG. 7, to be printed.

It may be noted that the methods described above are different examples for using Eqs. (9) and (10). These methods may be freely combined or another approach may be derived from Eqs. (9) and (10).

Eq. (9), by definition, may have $2^m$ solutions. A method for directly solving Eq. (9) is discussed next. Solutions to Eq. (9) may be used as initial points to solve Eq. (8) using a local optimizer.

The fundamental Theorem of Algebra states that a polynomial equation of degree d may have d solutions in a complex domain, and that for a system of n polynomial equations with degree $d_i$ in the $i^{th}$ equation, there may exist $\Pi_i d_i$ solutions. Typical numerical methods used for solution may be resultant matrices, Newton method, and homotopy.

Optimization algorithms of the present disclosure preferably require a solution to a system of polynomial equations, having $2^m$ solutions in the complex domain, as shown in Eq. (9).

Homotopy-based solvers may be a better candidate for the equi-brightness concept of the present disclosure keeping in view solutions with arbitrary accuracy and the computational cost. Described below is a preferred embodiment of a method to numerically solve a system of quadratic equations, which may be encountered in source mask optimization (SMO), covering all of the solutions (real or complex) and facilitating path tracking.

At the start, there may be an original system of quadratic equations. For an initial system of quadratic equations, the solutions may be known. The initial system may have an order identical to an order of the original system. Applying homotopy, a path may be constructed. One may rotate the initial system through the path to obtain the original system. Using the path, all of the solutions of the initial system may be transformed to the solutions of the original system.

The system of quadratic equations in Eq. (9) may have the following format $$f_j(x) = x^T A_j x - 1 = 0, j = 1 \ldots n, \quad (11)$$

where $f_j: \mathbb{C}^n \to \mathbb{C}$, $x \in \mathbb{C}^n$ and $A_j$, a coefficient matrix, may be an n×n matrix of real numbers. Let $f(x) = [f_1(x) \ldots f_n(x)]^T$. It may be noted that if the Eq. (9) were to be solved in more than one stage or to solve Eq. (10), then the resulting Eq. (11) may have some linear terms. Accordingly, Eq. (11) as written above without any linear term may be considered.

The initial system of quadratic equations is defined next. For j=1 ... n, let $$q_j(x) = a_j x_j^2 - b_j = 0, \quad (12)$$

where $a_j$ and $b_j$ may be nonzero, complex and otherwise arbitrary scalars. The initial system has $2^n$ solution of a form $[x_1^* \ldots x_n^*]$, where $x_j^* = \pm\sqrt{b_j/a_j}$. Let $$q(x) = [q_1(x) \ldots q(x)]^T.$$

The homotopy $H(x,t): C^n \times [0,1] \to C^n$ may be defined as below:

$$H(x,t) = tf(x) + (1-t)q(x) = 0. \quad (13)$$

The term f(x) may represent the sampling points shown, for example, in FIG. 8, such as the bright points 802, 804, 808, and 810 and the natural sampling point 806 in the plot 800A. It may be observed that when t=1, Eq. (13) may be the original system of quadratic equations and when t=0, Eq. (13) may be the initial system of quadratic equations having known solutions. To find the path from the initial system of quadratic equations to the original system of quadratic equations as t changes from zero to one, x may be parameterized with respect to t and considered as x=x(t). Now, differentiating H(x,t)=0 with respect to t generates $$\frac{\partial H}{\partial x}\frac{dx}{dt} + \frac{\partial H}{\partial t} = 0, \quad (14)$$

or $$\frac{dx}{dt} = -\left(\frac{\partial H}{\partial x}\right)^{-1}\frac{\partial H}{\partial t}. \quad (15)$$

Substituting for H(x,t) from Eq. (13), $$\frac{dx}{dt} = -[t\nabla_x f(x) + (1-t)\nabla_x q(x)]^{-1}[f(x) - q(x)]. \quad (16)$$

The right-hand-side of Eq. (16) may be further simplified to $$[t\nabla_x f(x) + (1-t)\nabla_x q(x)]_j = 2tx^T A_j + 2(1-t)a_j x_j e_j$$

$$[f(x) - q(x)]_j = x^T A_j x - 1 - a_j x_j^2 + b_j, \quad (17)$$

where $[.]_j$ may be the $j^{th}$ row of the expression inside brackets and $e_j$ may be the $j^{th}$ unit vector in $\Re^n$. Eq. (16) may be a system of ordinary differential equations (ODE) for x having variable t. In particular, if a solution to the initial system may be fixed and called $x_q \in C^n$, then solving Eq. (16) with $x_q$ as initial condition at t=0 may result in x* at t=1. Here x* may be a solution to the original system of quadratic equations.

An embodiment of the algorithm may be summarized as: [1] finding all of the $2^n$ distinct solutions to the initial system in Eq. (12), and [2] solving the ODE in Eq. (16) for $2^n$ times, each time with one of the solutions in [1] as an initial condition.

Following are some examples of system of quadratic equations that were solved using an implementation of an embodiment of a method of the present disclosure in a standard computation software. The first two examples are for the case of n=2 and the last example is for the case of n=3:

$$2x_1^2 + x_2^2 = 1 \quad (18)$$
$$x_1^2 + x_2^2 + \frac{2}{5}x_1 x_2 = 1,$$

$$x_1^2 + x_2^2 = 1 \quad (19)$$
$$\frac{1}{2}x_1^2 + \frac{1}{2}x_2^2 = 1,$$

$$x_1^2 + x_2^2 + x_3^2 = 1 \quad (20)$$
$$\frac{3}{2}x_1^2 + \frac{2}{5}x_2^2 + x_3^2 + \frac{2}{5}x_1 x_2 = 1$$
$$x_1^2 + \frac{2}{5}x_2^2 + \frac{3}{2}x_3^2 + \frac{2}{5}x_2 x_3 = 1,$$

The system of equations in the first example is given in Eqs. (18). The solutions of Eqs. (18) may be physically interpreted as the intersections of two ellipses. The standard computation software solved this system in 0.46 seconds on a 2.33 GHz x86-class CPU.

The results are shown in Eq. (21).

$$x^{*1} = (0.3482, 0.8704)$$

$$x^{*2} = (0.0000, 1.0000)$$

$$x^{*3} = (0.0000, -1.0000)$$

$$x^{*4} = (-0.3482, -0.8704). \quad (21)$$

Figure 9:
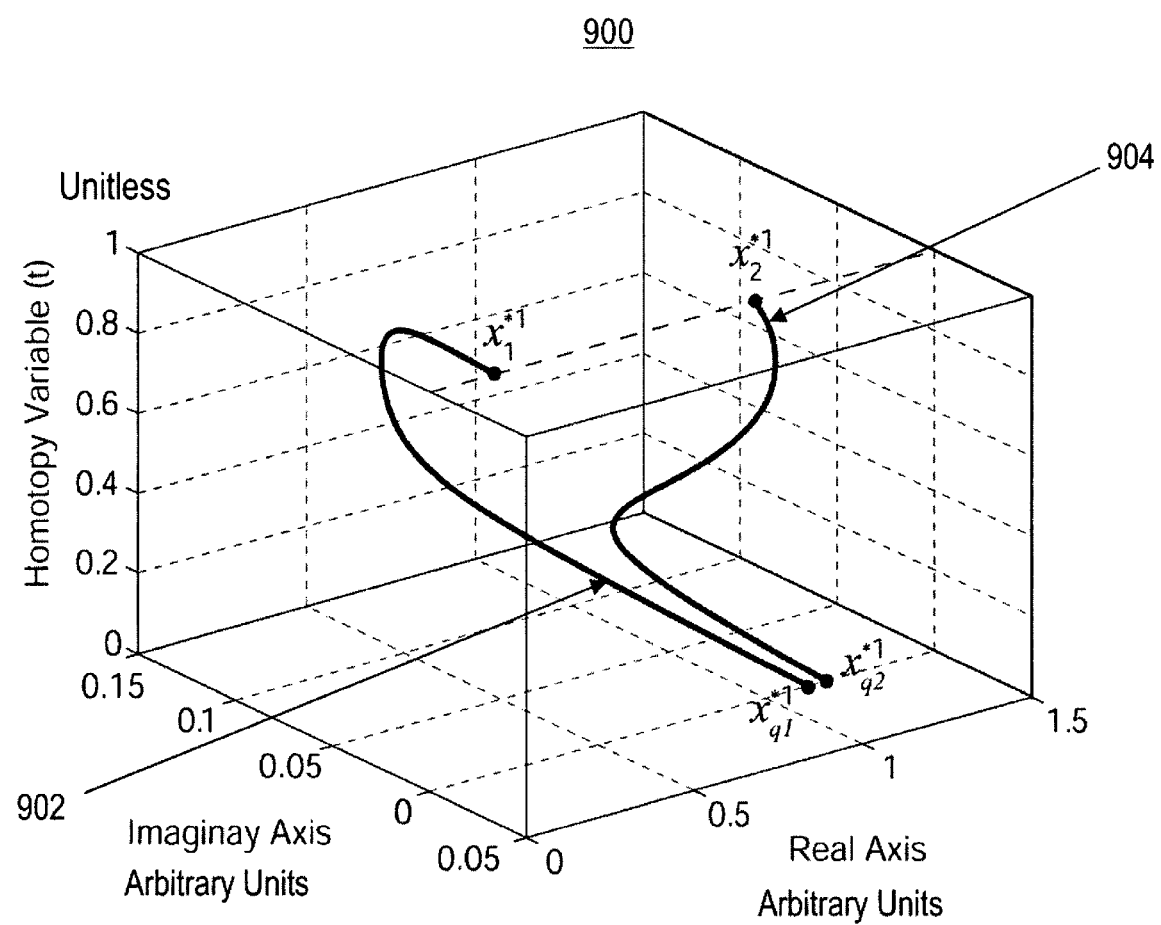
FIG. 9 illustrates homotopy paths of the present disclosure.

FIG. 9 illustrates homotopy paths of the present disclosure. The homotopy paths shown are for $x^{*1} = (x_1^{*1}, x_2^{*1})$ related to Eq. (18). Each homotopy path is for one of the components of $x^{*1}$, namely $x_1^{*1}$, represented by path 902, and $x_2^{*1}$, represented by path 904. It may be noted how at t=1 the imaginary parts of both components of $x^{*1}$ may become zero as a final solution (0.3482, 0.8704) is attained.

The system of equations in the second example is given in Eqs. (19). The solutions of Eqs. (19) may be physically interpreted as an intersections of two circles. But the two circles given in these equations may have no intersection and thus there may be no real solution to this system of equations and all of the solutions may be complex. The standard computation software solved this system in 0.89 seconds on a 2.33 GHz x86-class CPU. The results are in Eq. (22) which may be additional homotopy paths not shown in FIG. 3.

$$x^{*1} = 10^6 \times (3.0514 + 7.4101i, 7.4101 - 3.0514i)$$

$$x^{*2} = 10^6 \times (-3.0514 - 7.4101i, 7.4101 - 3.0514i)$$

$$x^{*3} = 10^6 \times (3.0514 + 7.4101i, -7.4101 + 3.0514i)$$

$$x^{*4} = 10^6 \times (-3.0514 - 7.4101i, -7.4101 + 3.0514i). \quad (22)$$

The system of equations in the third example is given in Eqs. (20). The solutions of Eqs. (20) may be physically interpreted as an intersections of three ellipsoids. The standard computation software solved this system in 0.48 seconds on a 2.33 GHz x86-class CPU. The results are in Eq. (23).

$$x^{*1} = (0.5196, 0.6783, 0.5196)$$

$$x^{*2} = (-0.7792, 0.4975, 0.3812)$$

$$x^{*3} = (0.6445, -0.4115, 0.6445)$$

$$x^{*4} = (-0.3813, -0.4977, 0.7793)$$

$x^{*5}=(0.3813,0.4977,-0.7793)$ $x^{*6}=(-0.6445,0.4115,-0.6445)$ $x^{*7}=(0.7792,-0.4975,-0.3812)$ $x^{*8}=(-0.5196,-0.6783,-0.5196).$ (23)

A simple Newton method based ODE solver has been used to solve this system of ODEs in Eq. (16). The solution times mentioned above may be further reduced if necessary.

A calculation of each solution requires some steps on the homotopy path and the accuracy of the final solution depends on an accuracy of each step. It may be possible to set the accuracy of each step. By counting the number of steps taken in the homotopy path tracking code, such counting being equivalent to the number of steps taken in the ODE solution, a bound may be found on an error of the final solutions. In this manner, a final accuracy may be controlled by means of controlling the accuracy of each numerical step.

It may be noted that one of the advantages of the disclosed method may be that the homotopy path does not tend to infinity for non-real solutions. However, there may still be a major difference in the path length when the final solutions are all complex. This may be seen by comparing the time required to solve example 1 and the time required to solve example 2. Another point to consider may be that longer path may mean less accuracy. Thus, fully complex solutions may tend to have less accuracy compared to real solutions.

Another aspect to be noted in the code developed for use with the standard computation software is a choice of $a_j$ and $b_j$ in Eq. (12). In the code, $a_j$ and $b_j$ have been chosen randomly and hence each time the code is run, even without changing the system of equations to be solved, a new initial system of equation may be developed. Theoretically, independent of the initial system, the final solutions converge to the solutions of the original system with a probability close to one. However, due to a numerical nature of the algorithm as well as the finite and non-zero error involved, the final solution may slightly vary with each run.

A variation of the final solution may be a measure of the accuracy of the final solution. Therefore, it may be preferable to set the accuracy of each step in the homotopy path tracking algorithm or to run the code at least two times to get an understanding of the accuracy of the underlying results.

Once the solutions to Eq. (9), i.e., all $a_0^*$, are found, a local optimizer (such as steepest descent method or Newton method) may be used to find a global optimum solution, i.e. $a^*$. The local optimizer may be run and $a_0^*$ may be used as a starting estimate, covering all found $a_0^*$, i.e., $2^m$ times. Out of all local optimums obtained, an optimum closest to the origin in the joint eigenvector space $\alpha$ may be selected.

It may be noted that many of the $2^m$ solutions to Eq. (9) may be complex. In those cases, the complex solution may be projected into a real hyperplane and used in the aforementioned algorithm.

In another embodiment of a method of the present disclosure, the method may include: projecting a plurality of bright patterns having a plurality of bright points and a plurality of dark patterns having a plurality of dark points on a substrate, such as the wafer 150 of FIG. 1, generating a plurality of joint eigenvectors of the plurality of bright points and a plurality of dark points, such as the joint eigenvectors 800A, 800B, 800C, 800D, 800E of FIG. 8, selecting a predetermined number of joint eigenvectors to project the plurality of bright patterns, such as the joint eigenvectors 800A, 800B, 800C, 800D, 800E of FIG. 8, generating a plurality of natural sampling points from the plurality of bright points, wherein the plurality of natural sampling points has a predetermined intensity defined by:

$$a_0^* \in \overline{W} \arg\min \overline{\alpha}^T \overline{\alpha}.$$

$$\sum_{\mu=1}^{M} c_\mu^j \overline{\alpha}^T \hat{B}_\mu \overline{\alpha} = c_0^j, 1 \le \mu \le m \text{ where}$$

M=an upper limit of the index $\mu$,
$\mu$=the index,
$c^j_\mu$=one or more scalar constants,
$c^j_0$=a predetermined scalar constant, and
j=an index for a range 1 through m, and obtaining a representation of an aperture from the plurality of natural sampling points, wherein an image of the representation of the aperture has a substantially uniform intensity.

In the abovementioned method, the generating the plurality of natural sampling points may include setting a substantially equal intensity for the plurality of natural sampling points, wherein an optimum mask diffraction order of the predetermined number of joint eigenvectors is specified by:

$$a_0^* \epsilon \overline{W} \arg\min \overline{\alpha}^T \overline{\alpha}.$$

$\overline{\alpha}^T \hat{B}_\mu \overline{\alpha} = 1, 1 \le \mu \le m$, where a=a mask diffraction order space,
$\alpha$=a joint eigenvector space,
$a_0^*$=optimum mask diffraction order,
$\overline{W}$=an n row by m column matrix equal to a first m columns of transformation matrix W,
$\overline{\alpha}$=a vector where each member holds a value which represents an importance of a corresponding eigenvector of the joint eigenvector space,
$\overline{\alpha}^T$=a transposed matrix of the joint eigenvector space, a transposed vector alpha,
$\hat{B}_\mu$=a matrix of the plurality of natural sampling points,
$\mu$=an index of a range, and
m=a dimension of $\overline{\alpha}$.

Figure 10:
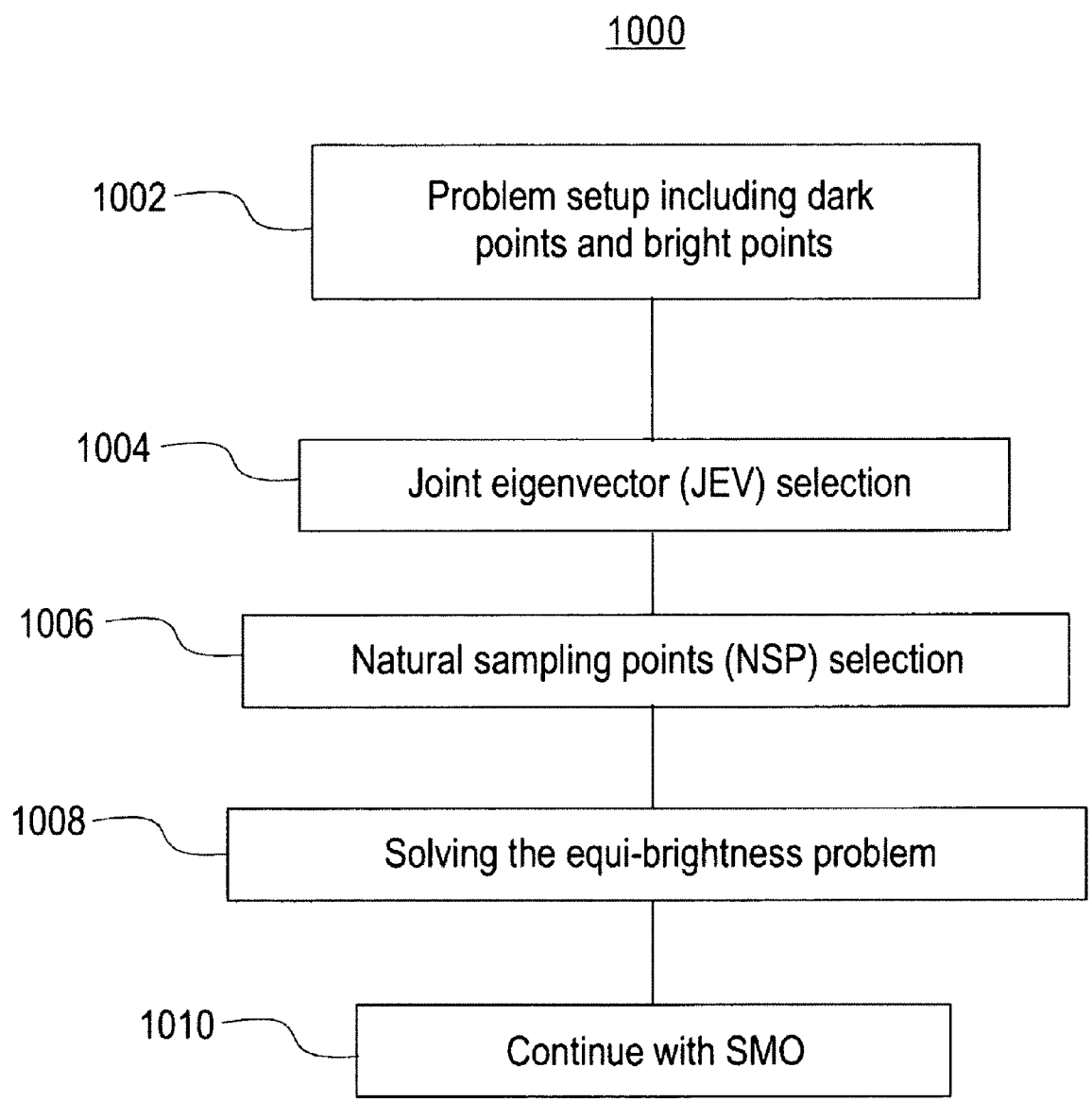
FIG. 10 illustrates another embodiment of a method of the present disclosure.

FIG. 10 illustrates another embodiment of a method 1000 of the present disclosure. The method 1000 may include performing problem setup including dark points and bright points (block 1002), selecting joint eigenvector (JEV) (block 1004), selecting NSPs (block 1006), solving the equi-brightness problem (block 1008), and continuing with SMO (block 1010).

Figure 11A:
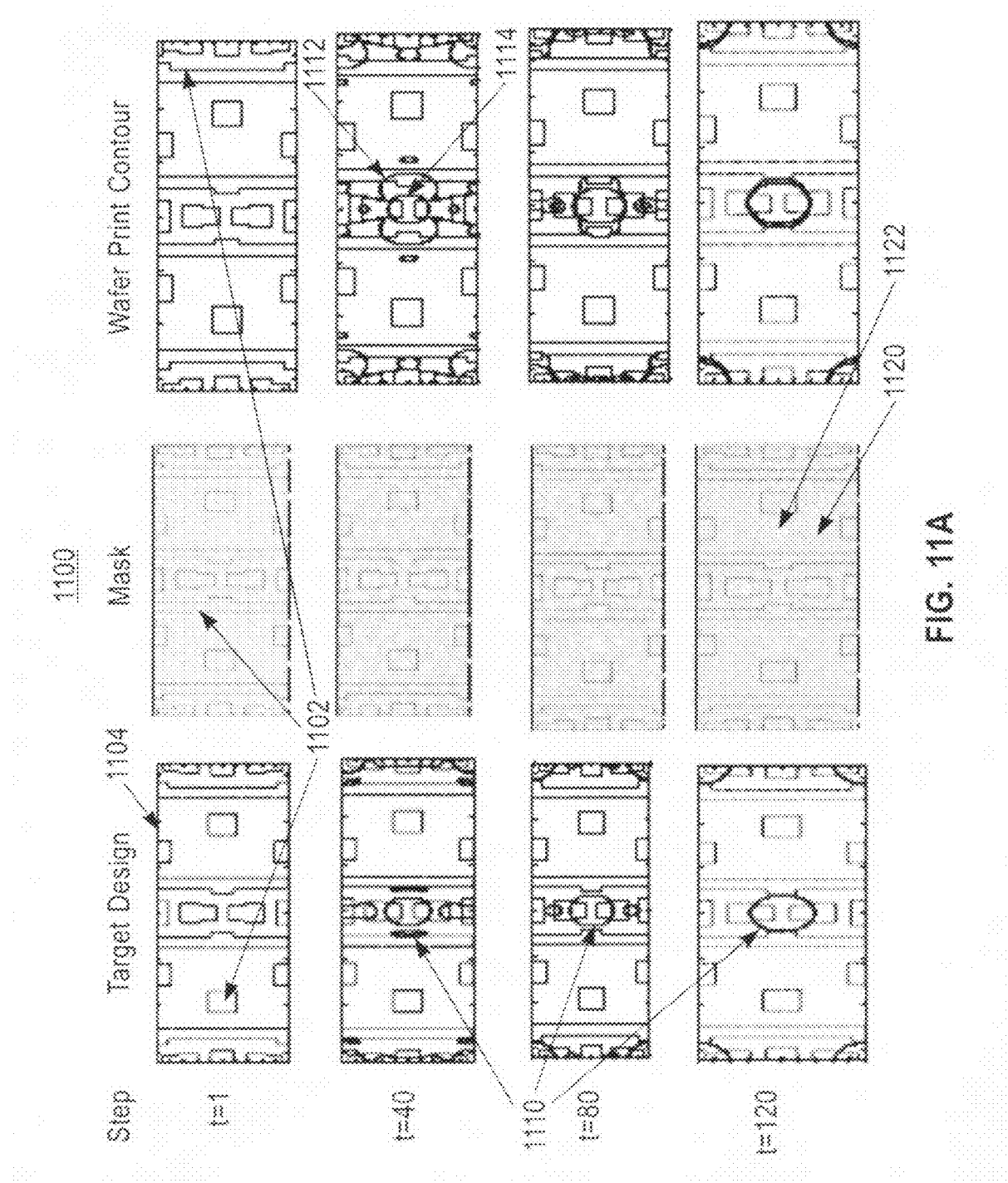
Figure 11C:
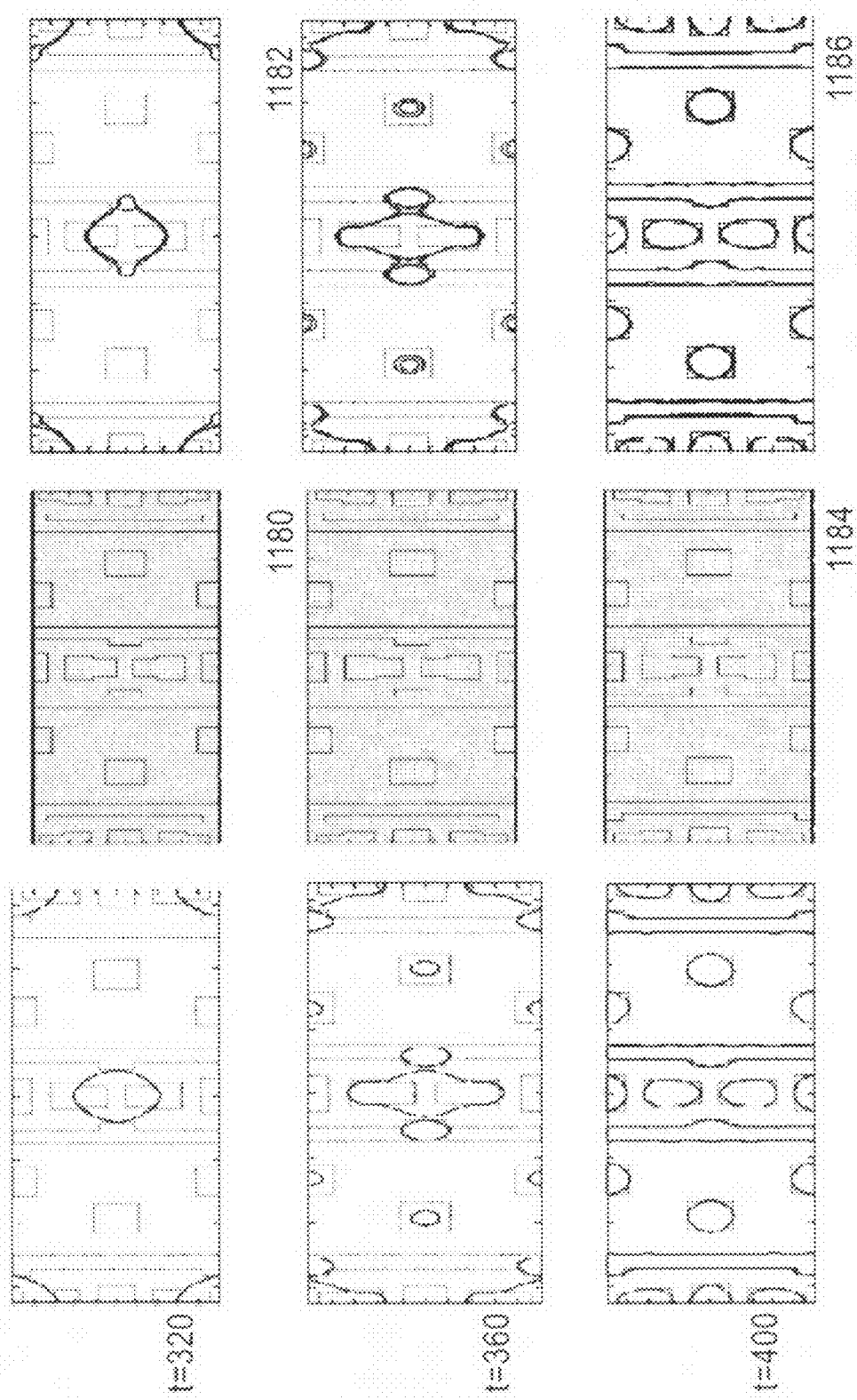

FIGS. 11A-11C illustrate simulation results involving a real design, a target design, and a mask of the present disclosure. The target design is shown in the left column, the mask is in the center column, and the wafer print contour is in the right column. The real design, represented by lines 1102, is to be printed on the wafer 150. The real design may be noticed in all columns and rows. At each step in the algorithm, the target design may be modified. The target design starts from the open-frame design, i.e., nothing to print, and ends up at the real design. There may be nothing to print at the start because a contour 1110 may be coinciding with a border 1104. The left column represents the target design, indicated by the contour 1110, as the target design evolves through the algorithm during each step. At each step in the algorithm, the mask required may be calculated to print the target design. The dark areas 1120 represent where the light is blocked and the light areas 1122 represent where the light can pass through mask. It may be noted that a mask of the center column may be a Chromeless Phase Lithography (CPL) mask. The dark areas 1120, in a case of the CPL mask, may permit a light to pass through the CPL mask freely. The light areas 1122, in the case of the CPL mask, may reverse the phase of the passing light through the CPL mask.

The Wafer Contour Plot shows the contour plot of what may print on the wafer 150 after using the current step's mask. The 1102 and 1114 contours show the two extremes of what would happen in a real wafer print experiment given practical lithographic condition variations (e.g., MEEF (Mask Error Enhancement Factor), defocus, dose, etc.).

It may be noted that the target design at each step (i.e., the contour 1102 on the left) may lie somewhere between the 1112 and 1114 contours in the right column. The closer the 1112 and 1114 contours are the better is the mask in printing the target design. Specifically, if the target design is close to the real design and the 1112 and 1114 contours are close to each other, a substantially optimum mask may be obtained.

The Step Numbers, in terms of t set equal to a number, are the number of times an ordinary differential equation (ODE) is solved in the algorithm. Therefore, in each step one ODE gets solved. In FIGS. 11A-11C, 400 simulation steps have been executed.

It may be noted that an amount of "true" progress may be different from one step to another. The amount may depend on the complexity, continuity, etc., of the ODE to be solved at each step. In FIGS. 11A-11C, the first 300 steps have mild progress whereas the last 100 steps have a relatively significant progress. It may also be noted that a measure of progress may be an amount by which the variable "t" is changed in Eq. (13). It may be noted that in one full run of the algorithm, "t" needs to change from 0 to 1 to transform the open-frame design to the real design.

It may be further noted in FIG. 11C that a mask 1180 at step 360 may appear closer to the real design 1104 at step 1 compared to a mask 1184 at step 400. However, a wafer print contour 1186 at step 400 is closer to the real design 1104 at step 1 compared to a wafer print contour 1182 at step 360. This may be an illustration of a capability of the method 300, and other methods described above, to process one or more non-linearities, generated primarily owing to destructive/constructive interference, to produce an improved wafer print contour.

Figure 12:
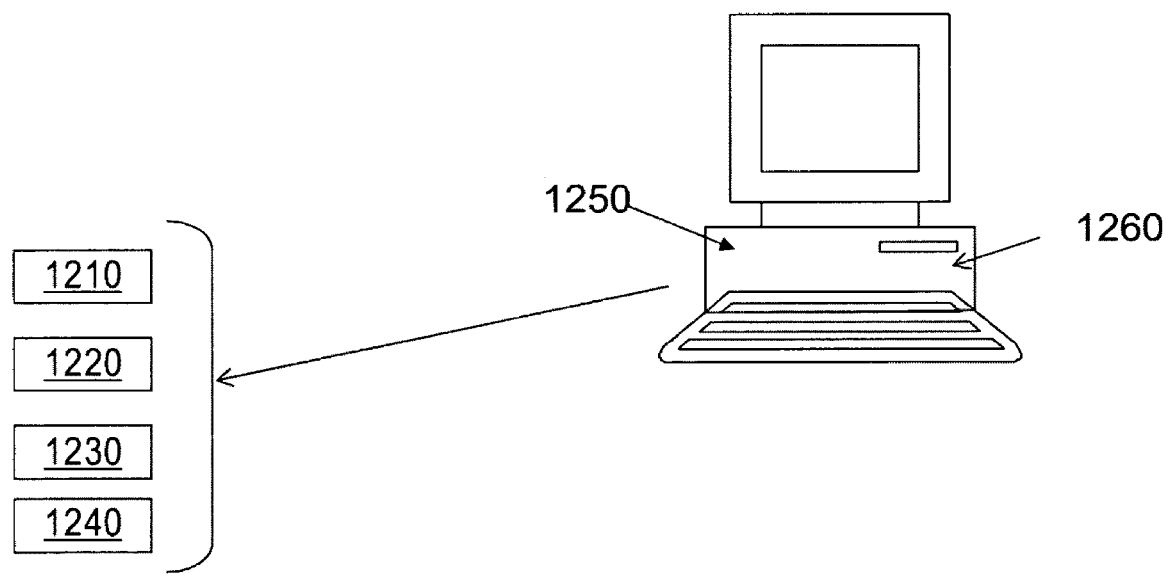
FIG. 12 illustrates an embodiment of a system of the present disclosure.

FIG. 12 illustrates an embodiment of a part of a system 1200 of the present disclosure. The system 1200 may include a projecting device configured to project a plurality of bright patterns having a plurality of bright points and a plurality of dark patterns having a plurality of dark points on a substrate, such as the wafer 150 of FIG. 1, wherein an optical device and the projecting device may be structurally arranged in a manner known in the art, a first processor 1210, the first processor 1210 coupled to the projecting device and the first processor 1210 being configured to generate a plurality of joint eigenvectors, such as the joint eigenvectors 800A, 800B, 800C, 800D, 800E of FIG. 8, of the plurality of bright points and a plurality of dark points, a selector 1220, the selector 1220 coupled to the first processor 1210 and the selector being configured to select a predetermined number of joint eigenvectors to project the plurality of bright patterns, a second processor 1230, the second processor 1230 coupled to the first processor 1210 and the second processor 1230 being configured to generate a plurality of natural sampling points from the plurality of bright points, wherein the plurality of natural sampling points has a substantially equal intensity; and a third processor 1240, the third processor 1240 coupled to the first processor 1210 and the third processor 1240 being configured to obtain a representation of an aperture from the plurality of natural sampling points, wherein an image of the representation of the aperture has a substantially uniform intensity. An example of the image of the representation of the aperture may be an image of one or more of the apertures 702, 704, 708, 712, of the mask 700 as shown in FIG. 7 discussed above.

The system 1200 may include a computer 1250 having a computer program product 1260. The first processor 1210, the second processor 1230, and the third processor 1230 may be combined in a single processor in a manner known in the art. In the system 1200, the projecting device may be further configured to select at least one of an intensity distribution having a predetermined value, a polarization distribution having a predetermined value, a substantially ideal substrate pattern having a predetermined value, a numerical aperture having a predetermined value, and a wavelength of illumination having a predetermined value. In the system 1200, the projecting device may be further configured to generate at least one of a dark region matrix from the plurality of dark points and a bright region matrix from the plurality of bright points.

In the system 1200, the first processor 1210 may be further configured to generate at least one of a plurality of joint eigenvalues of the plurality of bright points and a plurality of joint eigenvalues of the plurality of dark points. In the system 1200, the second processor 1220 may be further configured to resample the plurality of natural sampling points to obtain substantially equal intensities at the plurality of natural sampling points. In the system 1200, the third processor 1240 may be further configured to solve a plurality of quadratic equations applying a homotopy. The system 1200 may include a mask-making device coupled to the projecting device.

The computer program product 1260 may have computer-executable instructions for: projecting a plurality of bright patterns having a plurality of bright points and a plurality of dark patterns having a plurality of dark points on a substrate, generating a plurality of joint eigenvectors of the plurality of bright points and a plurality of dark points, selecting a predetermined number of joint eigenvectors to project the plurality of bright patterns, generating a plurality of natural sampling points from the plurality of bright points, wherein the plurality of natural sampling points has a substantially equal intensity, and obtaining a representation of an aperture from the plurality of natural sampling points, wherein an image of the representation of the aperture has a substantially uniform intensity.

The terminology used herein is for the purpose or describing particular embodiments only and is not intended to be limiting or the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. An embodiment was chosen and described in order to best explain the principles of the invention and the practical application, and to enable others of ordinary skill in the art to understand the invention for various embodiments with various modifications as are suited to the particular use contemplated.

As a person having ordinary skill in the art would appreciate, the elements or blocks of the methods described could take place at the same time or in an order different from the described order.

It should be emphasized that the above-described embodiments are merely some possible examples of implementation, set forth for a clear understanding of the principles of the disclosure. Many variations and modifications may be made to the above-described embodiments of the invention without departing substantially from the principles of the invention. All such modifications and variations are intended to be included herein within the scope of this disclosure and the present invention and protected by the following claims.

What is claimed is:

1. A method comprising:
   using at least provided information corresponding to a pattern to be printed on a substrate, determining a plurality of bright points at an image plane and a plurality of dark points at the image plane;
   generating a plurality of joint eigenvectors corresponding to the plurality of bright points and the plurality of dark points;
   selecting a number of the plurality of joint eigenvectors suitable to project the pattern as determined by at least one metric, the number of selected joint eigenvectors less than the number of the plurality of joint eigenvectors;
   generating a plurality of natural sampling points using the plurality of bright points and the selected joint eigenvectors, wherein each of the plurality of natural sampling points has a substantially equal intensity;
   using the plurality of generated natural sampling points to determine a plurality of possible solutions corresponding to masks suitable for printing the pattern on the substrate;
   selecting one of the possible solutions according to predetermined criteria as a best solution of the possible solutions for printing the pattern on the substrate; and
   outputting information corresponding to the selected solution, the information suitable for creating a mask suitable for printing the pattern on the substrate.

2. The method of claim 1, wherein the generating the plurality of natural sampling points comprises setting a value of intensity at each of the plurality of natural sampling points substantially equal to a predetermined value of intensity.

3. The method of claim 1, wherein the provided information comprises selecting at least one of an intensity distribution having a predetermined value, a polarization distribution having a predetermined value, a substantially ideal substrate pattern having a predetermined value, a numerical aperture having a predetermined value, and a wavelength of illumination having a predetermined value.

4. The method of claim 1, wherein the determining the plurality of dark points comprises generating a dark region matrix from the plurality of dark points.

5. The method of claim 1, wherein the determining the plurality of bright points comprises generating a bright region matrix from the plurality of bright points.

6. The method of claim 1, wherein the generating the plurality of joint eigenvectors comprises generating a plurality of joint eigenvalues corresponding to the plurality of bright points.

7. The method of claim 1, wherein the generating the plurality of joint eigenvectors comprises generating a plurality of joint eigenvalues corresponding to the plurality of dark points.

8. The method of claim 1, wherein the generating the plurality of natural sampling points comprises resampling, using the selected joint eigenvectors, the plurality of bright points to obtain substantially equal intensities at the plurality of natural sampling points.

9. The method of claim 1, wherein the generating the plurality of natural sampling points comprises at least one of selecting a plurality of homogeneous natural sampling points, and selecting one or more of a plurality of edge points as the plurality of natural sampling points.

10. The method of claim 1, wherein using the plurality of generated natural sampling points to determine a plurality of possible solutions comprises solving a plurality of quadratic equations corresponding to mask diffraction orders for a mask by applying a homotopy to the plurality of quadratic equations, the plurality of generated natural sampling points at least partially defining a set of equality constraints on the mask diffraction orders, and each generated natural sampling point corresponding to one of the plurality of possible solutions.

11. The method of claim 1, wherein the generating the plurality of natural sampling points comprises setting a predetermined number of the plurality of natural sampling points equal to the number of the selected joint eigenvectors.

12. The method of claim 1, wherein the generating the plurality of natural sampling points comprises processing one joint eigenvector in a step for attaining a predetermined threshold substantially equal to a predetermined intensity.

13. A system comprising:
    at least one processor configured to:
    using at least provided information corresponding to a pattern to be printed on a substrate, determine a plurality of bright points at an image plane and a plurality of dark points at the image plane;
    generate a plurality of joint eigenvectors corresponding to the plurality of bright points and the plurality of dark points;
    select a number of joint eigenvectors suitable to project the pattern as determined by at least one metric, the number of selected joint eigenvectors less than the number of the plurality of joint eigenvectors;
    generate a plurality of natural sampling points using the plurality of bright points and the selected joint eigenvectors, wherein the plurality of natural sampling points has a substantially equal intensity;
    use the plurality of generated natural sampling points to determine a plurality of possible solutions corresponding to masks suitable for printing the pattern on the substrate;
    select one of the possible solutions according to predetermined criteria as a best solution of the possible solutions for printing the pattern on the substrate; and
    output information corresponding to the selected solution, the information suitable for creating a mask suitable for printing the pattern on the substrate.

14. The system of claim 13, wherein the provided information comprises at least one of an intensity distribution having a predetermined value, a polarization distribution having a predetermined value, a substantially ideal substrate pattern having a predetermined value, a numerical aperture having a predetermined value, and a wavelength of illumination having a predetermined value.

15. The system of claim 13, wherein the at least one processor is further configured to generate at least one of a dark region matrix from the plurality of dark points and a bright region matrix from the plurality of bright points.

16. The system of claim 13, wherein the at least one processor is further configured to generate at least one of a plurality of joint eigenvalues corresponding to the plurality of bright points and a plurality of joint eigenvalues corresponding to the plurality of dark points.

17. The system of claim 13, wherein the at least one processor is further configured to resample, using the selected joint eigenvectors, the plurality of bright points to obtain substantially equal intensities at the plurality of natural sampling points.

18. The system of claim 13, wherein the system further comprises a mask-making device coupled to the at least one processor and configured to make a mask using the output information corresponding to the selected solution.

19. A method comprising:
projecting a plurality of bright patterns having a plurality of bright points and a plurality of dark patterns having a plurality of dark points on a substrate;
generating a plurality of joint eigenvectors of the plurality of bright points and a plurality of dark points;
selecting a predetermined number of joint eigenvectors to project the plurality of bright patterns;
generating a plurality of natural sampling points from the plurality of bright points, wherein the plurality of natural sampling points has a predetermined intensity defined by:

$$a_0^* \in \overline{W} \operatorname{argmin} \overline{\alpha}^T \overline{\alpha},$$

$$\sum_{\mu=1}^{M} c_\mu^j \overline{\alpha}^T \hat{B}_\mu \overline{\alpha} = c_0^j, \ 1 \leq \mu \leq m \text{ where}$$

M=an upper limit of the index $\mu$,
$\mu$=the index,
$c_\mu^j$=one or more scalar constants,
$c_0^j$=a predetermined scalar constant, and
j=an index for a range 1 through m; and
obtaining a representation of an aperture from the plurality of natural sampling points, wherein an image of the representation of the aperture has a substantially uniform intensity.

20. The method of claim 19, wherein the generating the plurality of natural sampling points comprises setting a substantially equal intensity for the plurality of natural sampling points, wherein an optimum mask diffraction order of the predetermined number of joint eigenvectors is specified by:

$$a_0^* \epsilon \overline{W} \operatorname{argmin} \overline{\alpha}^T \overline{\alpha},$$

$\overline{\alpha}^T B_\mu \overline{\alpha} = 1, 1 \leq \mu \leq m$, where a=a mask diffraction order space,
$\alpha$=a joint eigenvector space,
$a_0^*$=optimum mask diffraction order,
$\overline{W}$=an n row by m column matrix equal to a first m columns of transformation matrix W,
$\overline{\alpha}$=a vector where each member holds a value which represents an importance of a corresponding eigenvector of the joint eigenvector space,
$\overline{a}^T$=a transposed matrix of the joint eigenvector space, a transposed vector alpha,
$\hat{B}_\mu$=a matrix of the plurality of natural sampling points,
$\mu$=an index of a range, and
m=a dimension of $\overline{\alpha}$.

21. A computer program product comprising a computer readable storage medium having computer-executable instructions embodied thereon for causing at least one processor to perform at least the following:
using at least provided information corresponding to a pattern to be printed on a substrate, determining a plurality of bright points at an image plane and a plurality of dark points at the image plane;
generating a plurality of joint eigenvectors corresponding to the plurality of bright points and the plurality of dark points;
selecting a number of the plurality of joint eigenvectors suitable to project the pattern as determined by at least one metric, the number of selected joint eigenvectors less than the number of the plurality of joint eigenvectors;
generating a plurality of natural sampling points using the plurality of bright points and the selected joint eigenvectors, wherein each of the plurality of natural sampling points has a substantially equal intensity;
using the plurality of generated natural sampling points to determine a plurality of possible solutions corresponding to masks suitable for printing the pattern on the substrate;
selecting one of the possible solutions according to predetermined criteria as a best solution of the possible solutions for printing the pattern on the substrate; and
outputting information corresponding to the selected solution, the information suitable for creating a mask suitable for printing the pattern on the substrate.

22. The method of claim 1, further comprising making a mask using the output information corresponding to the selected solution.

23. The method of claim 1, used in the fabrication of integrated circuit chips.

* * * * *